United States Patent
Miyagi et al.

(10) Patent No.: US 9,972,515 B2
(45) Date of Patent: May 15, 2018

(54) SUBSTRATE PROCESSING APPARATUS AND SUBSTRATE PROCESSING METHOD

(71) Applicant: DAINIPPON SCREEN MFG., CO., LTD., Kyoto-shi, Kyoto (JP)

(72) Inventors: Masahiro Miyagi, Kyoto (JP); Kenichiro Arai, Kyoto (JP)

(73) Assignee: SCREEN HOLDINGS CO., LTD., Kyoto (JP)

( * ) Notice: Subject to any disclaimer, the term of this patent is extended or adjusted under 35 U.S.C. 154(b) by 1025 days.

(21) Appl. No.: 14/142,586

(22) Filed: Dec. 27, 2013

(65) Prior Publication Data

US 2014/0202496 A1    Jul. 24, 2014

(30) Foreign Application Priority Data

Dec. 28, 2012  (JP) .............................. P2012-286859
Dec. 28, 2012  (JP) .............................. P2012-286860

(51) Int. Cl.
*B08B 3/04*     (2006.01)
*H01L 21/67*    (2006.01)
*H01L 21/02*    (2006.01)

(52) U.S. Cl.
CPC ...... *H01L 21/6715* (2013.01); *H01L 21/6704* (2013.01); *H01L 21/67051* (2013.01); *H01L 21/02057* (2013.01)

(58) Field of Classification Search
None
See application file for complete search history.

(56) References Cited

U.S. PATENT DOCUMENTS 6,367,490 B1    4/2002  Namba
2003/0045218 A1  3/2003  Kasahara et al.
(Continued)

FOREIGN PATENT DOCUMENTS

CN    1404124 A     3/2003
JP    61-156740 A    7/1986
(Continued)

OTHER PUBLICATIONS

Machine translation of JP2006-140285 by Akio Hashizume, publishes Jun. 1, 2006.*

*Primary Examiner* — Mikhail Kornakov
*Assistant Examiner* — Ryan L. Coleman
(74) *Attorney, Agent, or Firm* — McDermott Will & Emery LLP

(57) ABSTRACT

In a substrate processing apparatus, a temperature of an anti-static liquid having electrical resistivity which gradually decreases as a liquid temperature increases is adjusted by a temperature adjustment part and the electrical resistivity of the anti-static liquid is higher than the electrical resistivity of a processing liquid (SPM liquid). After that, a plurality of substrates are immersed in the anti-static liquid inside the anti-static liquid storage part and both main surfaces of each substrate entirely conic into contact with the anti-static liquid. This gradually removes static electricity from the substrate. Then, the SPM liquid is supplied onto an upper surface of the substrate to thereby perform an SPM process. In the SPM process, it is thereby possible to prevent a large amount of electric charges from sharply moving from the substrate to the SPM liquid and prevent any damage to the substrate.

21 Claims, 19 Drawing Sheets

(56) References Cited

U.S. PATENT DOCUMENTS

| | | | |
|---|---|---|---|
| 2004/0211449 A1 | 10/2004 | Yokomoto et al. | |
| 2005/0274393 A1 | 12/2005 | Pemg et al. | |
| 2007/0105242 A1 | 5/2007 | Shiki et al. | |
| 2007/0181163 A1 | 8/2007 | Wada et al. | |
| 2008/0314870 A1* | 12/2008 | Inoue | B08B 1/04 216/38 |
| 2009/0211610 A1 | 8/2009 | Honbe et al. | |
| 2009/0320885 A1* | 12/2009 | Inoue | H01L 21/31138 134/104.2 |
| 2011/0089137 A1 | 4/2011 | Tanaka et al. | |
| 2013/0084709 A1 | 4/2013 | Miyagi et al. | |
| 2013/0084710 A1 | 4/2013 | Miyagi | |

FOREIGN PATENT DOCUMENTS

| | | | |
|---|---|---|---|
| JP | 02-083926 A | | 3/1990 |
| JP | 2003-188138 A | | 7/2003 |
| JP | 2004-158588 A | | 6/2004 |
| JP | 2006-140285 | * | 6/2006 |
| JP | 2007-134673 A | | 5/2007 |
| JP | 2007-214347 A | | 8/2007 |
| JP | 2009-200365 A | | 9/2009 |
| JP | 2011-103438 A | | 5/2011 |
| JP | 2013-077625 A | | 4/2013 |
| JP | 2013-077626 A | | 4/2013 |
| KR | 10-0296827 B1 | | 10/2001 |
| KR | 10-2008-0006806 A | | 1/2008 |
| TW | 200540980 A | | 12/2005 |

* cited by examiner

SUBSTRATE PROCESSING APPARATUS AND SUBSTRATE PROCESSING METHOD

TECHNICAL FIELD

The present invention relates to a technique for processing a substrate.

BACKGROUND ART

In a process of manufacturing a semiconductor substrate (hereinafter, referred to simply as a "substrate"), conventionally, various processings are performed on a substrate having an insulating film such as an oxide film or the like thereon by using a substrate processing apparatus. By supplying a processing liquid onto a substrate having a surface on which a resist pattern is formed, for example, a processing such as etching or the like is performed on the surface of the substrate. Further, after etching or the like is finished, a process of removing the resist from the substrate is also performed.

In a substrate processing apparatus disclosed in Japanese Patent Application Laid-Open No. 2009-200365 (Document 1), before a processing using a processing liquid such as an SPM (sulfuric acid/hydrogen peroxide mixture) liquid or the like is performed, a liquid having electrical conductivity lower than that of the processing liquid is supplied to a processing area on a substrate and then the processing liquid is discharged to the processing area with the liquid existing therein. It is thereby possible to prevent any local damage of the substrate due to the contact made between the substrate and the processing liquid. The local damage of the substrate refers to local destruction of a field oxide film or a gate oxide film in the processing area, and the destruction is caused by bringing the processing area on the substrate into contact with the processing liquid which is electrically charged by the frictional electrification phenomenon between the processing liquid and a processing liquid nozzle.

Japanese Patent Application Laid-Open No. 2007-134673 (Document 2) discloses a technique in which before supplying a processing liquid such as concentrated sulfuric acid or the like to a processing area on a wafer, a liquid such as carbon dioxide water or the like having an electrical resistivity value lower than that of the processing liquid is supplied to the processing area and the processing liquid is discharged to the processing area with the liquid existing therein. It is thereby possible to prevent electrification caused by the electrostatic friction phenomenon which occurs when the processing liquid comes into contact with the processing area.

Japanese Patent Application Laid-Open No. 2007-214347 (Document 3) discloses a technique used in a cleaning apparatus for electronic devices, to eliminate static electricity existing on a surface of a substrate or in a processing liquid nozzle by supplying ionized vapor to the surface of the substrate or the processing liquid nozzle. In a substrate processing apparatus disclosed in Japanese Patent Application Laid-Open No. 2011-103438 (Document 4), before a liquid process on a circuit-forming surface of a substrate, a static elimination process of discharging an anti-static liquid toward a surface opposite to the circuit-forming surface of the substrate.

On the other hand, Japanese Patent Application Laid-Open No. 2004-158588 (Document 5) discloses a substrate processing apparatus which removes organic matter adhering to a surface of a substrate by supplying a removal liquid onto the surface of the substrate. The substrate processing apparatus includes a temperature control part for adjusting the temperature of the substrate so that a difference between the temperature of the substrate and the temperature of the removal liquid supplied onto the substrate may be within a predetermined range. As an example of the temperature control part, used is a fluid supply part for supplying a fluid whose temperature is adjusted onto a back surface of a substrate held by a holding rotating part.

A substrate to be processed by a substrate processing apparatus is subjected to a drying process such as dry etching, plasma CVD (Chemical Vapor Deposition), or the like, before being loaded into the substrate processing apparatus. In such a drying process, since electric charges are generated in a device, the substrate which is electrically charged is loaded into the substrate processing apparatus. Then, in the substrate processing apparatus, when a processing liquid having low electrical resistivity, such as an SPM liquid, is supplied onto the substrate, the electric charges in the device sharply move from the device to the processing liquid (in other words, the electric charges are discharged into the processing liquid) and damage may be caused in the device by heat generation due to the movement of the electric charges. Then, it is thought to be effective to remove static electricity from the substrate by using an ionizer before supplying the processing liquid onto the substrate, but when the amount of electrostatic charges on the substrate is too large, it is hard to efficiently remove static electricity from the substrate.

SUMMARY OF INVENTION

The present invention is intended for a substrate processing apparatus for processing a substrate, and it is an object of the present invention to prevent any damage to the substrate due to the movement of electric charges in a processing using a processing liquid.

The substrate processing apparatus according to an aspect of the present invention includes a substrate holding part for holding a substrate, a processing liquid supply part for supplying a processing liquid onto a first main surface which is one main surface of the substrate, an anti-static liquid contacting part for bringing the first main surface of the substrate and a second main surface which is the other main surface thereof into contact with an anti-static liquid having electrical resistivity which gradually decreases as a liquid temperature increases, a temperature adjustment part for adjusting a temperature of the anti-static liquid, and a control part for controlling the processing liquid supply part, the anti-static liquid contacting part, and the temperature adjustment part to bring entirely the first main surface and the second main surface of the substrate into contact with the anti-static liquid to maintain a wetted state, to thereby reduce electric charges on the substrate, and to then supply the processing liquid onto the first main surface of the substrate to thereby perform a predetermined process, while controlling the temperature of the anti-static liquid to be within a range in which the electrical resistivity of the anti-static liquid is higher than electrical resistivity of the processing liquid. It is thereby possible to prevent any damage to the substrate due to the movement of the electric charges in the processing using the processing liquid.

In one preferred embodiment of the present invention, the anti-static liquid being in contact with the first main surface and the anti-static liquid being in contact with the second main surface are continuous with each other on the substrate.

Preferably, the anti-static liquid contacting part includes an anti-static liquid storage part for storing the anti-static liquid therein, and the substrate is immersed in the anti-static liquid stored in the anti-static liquid storage part to thereby bring the first main surface and the second main surface into contact with the anti-static liquid. More preferably, a plurality of substrates including the substrate which are arranged so that the directions of the normals of respective main surfaces thereof are directed to a horizontal direction are immersed in the anti-static liquid stored in the anti-static liquid storage part.

In another preferred embodiment of the present invention, the anti-static liquid contacting part includes a first anti-static liquid contacting part for supplying the anti-static liquid onto the first main surface of the substrate which is held by the substrate holding part with the first main surface thereof directed upward to thereby puddle entirely the first main surface with the anti-static liquid and a second anti-static liquid contacting part provided oppositely to the second main surface of the substrate, for discharging the anti-static liquid onto the second main surface to thereby bring entirely the second main surface into contact with the anti-static liquid.

The substrate processing apparatus according to another aspect of the present invention includes a substrate holding part for holding a substrate with a main surface thereof directed upward, a processing liquid supply part for supplying a processing liquid onto the main surface of the substrate, an anti-static liquid supply part for supplying an anti-static liquid onto the main surface of the substrate, the anti-static liquid having electrical resistivity which gradually decreases as a liquid temperature increases, a temperature adjustment part for adjusting a temperature of the anti-static liquid supplied onto the substrate, and a control part for controlling the processing liquid supply part, the anti-static liquid supply part, and the temperature adjustment part to supply the anti-static liquid onto the main surface of the substrate to thereby puddle entirely the main surface of the substrate with the anti-static liquid, to thereby reduce electric charges on the substrate, and to then supply the processing liquid onto the main surface of the substrate to thereby perform a predetermined process, while controlling the temperature of the anti-static liquid to be within a range in which the electrical resistivity of the anti-static liquid is higher than electrical resistivity of the processing liquid. It is thereby possible to prevent any damage to the substrate due to the movement of the electric charges in the processing using the processing liquid.

In still another preferred embodiment of the present invention, the substrate processing apparatus further includes an anti-static liquid measurement part for measuring the temperature of the anti-static liquid, and in the substrate processing apparatus of the present invention, the control part controls the temperature adjustment part on the basis of a measurement result of the anti-static liquid measurement part so that a difference between the temperature of the anti-static liquid and a predetermined target temperature becomes smaller.

In yet another preferred embodiment of the present invention, the substrate processing apparatus further includes an anti-static liquid measurement part for measuring the electrical resistivity of the anti-static liquid, and in the substrate processing apparatus of the present invention, the control part controls the temperature adjustment part on the basis of a measurement result of the anti-static liquid measurement part so that a difference between the electrical resistivity of the anti-static liquid and a predetermined target electrical resistivity becomes smaller.

The present invention is also intended for a substrate processing method of processing a substrate. The substrate processing method according to an aspect of the present invention includes a) controlling a temperature of an anti-static liquid having electrical resistivity which gradually decreases as a liquid temperature increases, to be within a range in which the electrical resistivity of the anti-static liquid is higher than electrical resistivity of a processing liquid, b) bringing entirely both main surfaces of a substrate into contact with the anti-static liquid to maintain a wetted state, to thereby reduce electric charges on the substrate, after the operation a), and c) supplying the processing liquid onto one main surface of the substrate to thereby perform a predetermined process after the operation b). It is thereby possible to prevent any damage to the substrate due to the movement of the electric charges in the processing using the processing liquid.

The substrate processing method according to another aspect of the present invention includes a) controlling a temperature of an anti-static liquid having electrical resistivity which gradually decreases as a liquid temperature increases, to be within a range in which the electrical resistivity of the anti-static liquid is higher than electrical resistivity of a processing liquid, b) supplying the anti-static liquid onto a main surface of a substrate which is held with the main surface thereof directed upward to puddle entirely the main surface of the substrate with the anti-static liquid, to thereby reduce electric charges on the substrate, and c) supplying the processing liquid onto the main surface of the substrate to thereby perform a predetermined process after the operation b). It is thereby possible to prevent any damage to the substrate due to the movement of the electric charges in the processing using the processing liquid.

These and other objects, features, aspects and advantages of the present invention will become more apparent from the following detailed description of the present invention when taken in conjunction with the accompanying drawings.

DESCRIPTION OF EMBODIMENTS

Figure 1:
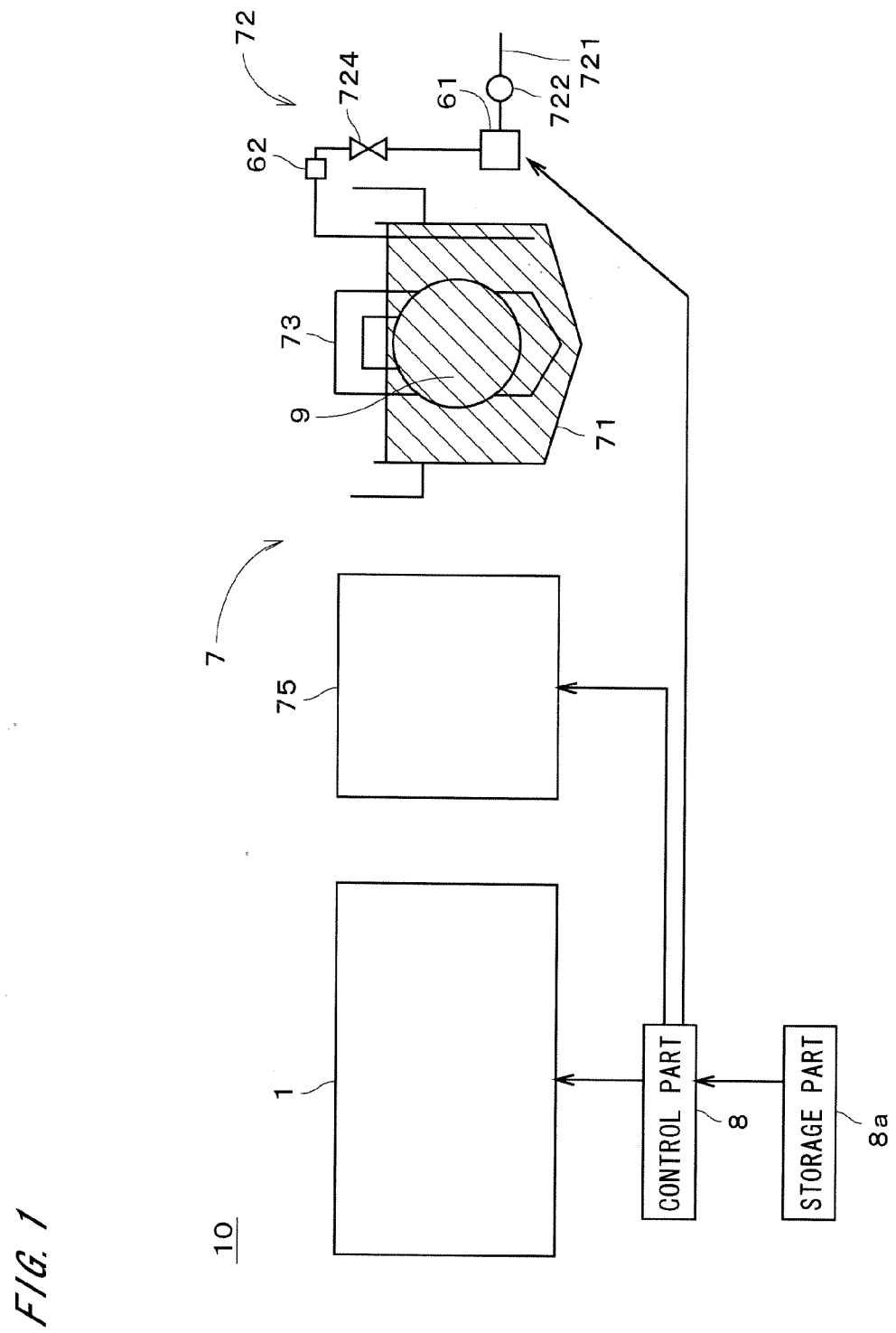
FIG. 1 is a view showing a configuration of a substrate processing apparatus in accordance with a first preferred embodiment of the present invention.

FIG. 1 is a view showing a configuration of a substrate processing apparatus 10 in accordance with the first preferred embodiment of the present invention. The substrate processing apparatus 10 is an apparatus for processing semiconductor substrates 9 (hereinafter, referred to simply as "substrates 9"). As shown in FIG. 1, the substrate processing apparatus 10 includes a single-substrate processing apparatus 1, an anti-static liquid contacting part 7, a temperature adjustment part 61, an anti-static liquid measurement part 62, and a control part 8.

The single-substrate processing apparatus 1 is a sheet-fed processing apparatus for processing substrates 9 one by one. The anti-static liquid contacting part 7 brings the substrate 9 into contact with an anti-static liquid. The temperature adjustment part 61 adjusts the temperature of the anti-static liquid. The anti-static liquid measurement part 62 is a temperature sensor for measuring the temperature of the anti-static liquid. A storage part 8a holds a target temperature and a static elimination time (discussed later in detail) and sets these temperature and time into the control part 8 when a substrate processing is performed. The control part 8 controls the single-substrate processing apparatus 1, the anti-static liquid contacting part 7, the temperature adjustment part 61, the anti-static liquid measurement part 62, and the like on the basis of the above target temperature and the like.

Figure 2:
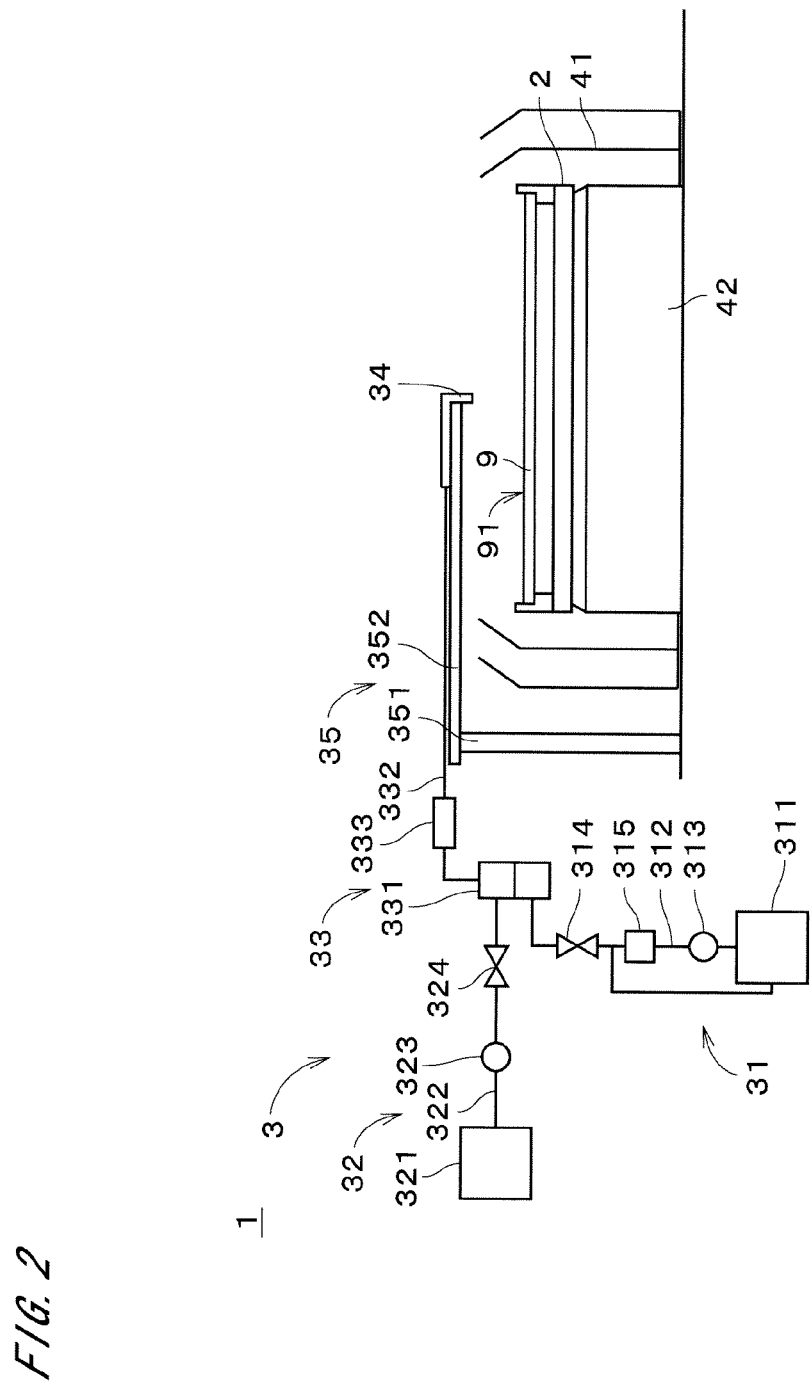
FIG. 2 is a view showing a configuration of a single-substrate processing apparatus.

FIG. 2 is a view showing a configuration of the single-substrate processing apparatus 1. In the single-substrate processing apparatus 1, an SPM (sulfuric acid/hydrogen peroxide mixture) liquid serving as a processing liquid is supplied onto the substrate 9, to thereby perform an SPM process, i.e., a process of removing a resist film from the substrate 9. The single-substrate processing apparatus 1 includes a substrate holding part 2, a processing liquid supply part 3, a cup part 41, and a substrate rotating mechanism 42. The substrate holding part 2 holds a substrate 9 with one main surface 91 (hereinafter, referred to as an "upper surface 91") thereof directed upward. The processing liquid supply part 3 supplies a processing liquid such as an SPM liquid or the like onto the upper surface 91 of the substrate 9. The cup part 41 surrounds the periphery of the substrate 9 and the substrate holding part 2. The substrate rotating mechanism 42 horizontally rotates the substrate 9 together with the substrate holding part 2. The substrate 9 is rotated by the substrate rotating mechanism 42 about a rotation axis which goes through a center of the substrate 9 and is perpendicular to the upper surface 91 of the substrate 9. In the single-substrate processing apparatus 1, the substrate holding part 2, the cup part 41, the substrate rotating mechanism 42, and the like are accommodated in a not-shown chamber.

The processing liquid supply part 3 includes a sulfuric acid supply part 31 for supplying sulfuric acid, a hydrogen peroxide water supply part 32 for supplying hydrogen peroxide water, a mixture generation part 33 connected to the sulfuric acid supply part 31 and the hydrogen peroxide water supply part 32, a processing liquid nozzle 34 disposed above the substrate 9, for discharging a liquid toward the substrate 9, and a processing liquid nozzle rotating mechanism 35 for horizontally rotating the processing liquid nozzle 34 about a rotation axis 351. The processing liquid nozzle rotating mechanism 35 includes an arm 352 horizontally extending from the rotation axis 351, to which the processing liquid nozzle 34 is attached.

The sulfuric acid supply part 31 includes a sulfuric acid storage part 311 for storing sulfuric acid therein, a sulfuric acid pipe 312 connected to the sulfuric acid storage part 311 and the mixture generation part 33, a sulfuric acid pump 313 for supplying the sulfuric acid from the sulfuric acid storage part 311 to the mixture generation part 33 through the sulfuric acid pipe 312, a sulfuric acid valve 314 provided on the sulfuric acid pipe 312, and a sulfuric acid heating part 315 provided on the sulfuric acid pipe 312 between the sulfuric acid pump 313 and the sulfuric acid valve 314, for heating the sulfuric acid. The sulfuric acid pipe 312 branches between the sulfuric acid heating part 315 and the sulfuric acid valve 314, being connected to the sulfuric acid storage part 311, and when the sulfuric acid valve 314 is closed, the sulfuric acid heated by the sulfuric acid heating part 315 circulates between the sulfuric acid storage part 311 and the sulfuric acid heating part 315.

The hydrogen peroxide water supply part 32 includes a hydrogen peroxide water storage part 321 for storing hydrogen peroxide water therein, a hydrogen peroxide water pipe 322 connected to the hydrogen peroxide water storage part 321 and the mixture generation part 33, a hydrogen peroxide water pump 323 for supplying the hydrogen peroxide water from the hydrogen peroxide water storage part 321 to the mixture generation part 33 through the hydrogen peroxide water pipe 322, and a hydrogen peroxide water valve 324 provided on the hydrogen peroxide water pipe 322. The sulfuric acid storage part 311 and the hydrogen peroxide water storage part 321 may be provided outside the substrate processing apparatus 10, being connected to the sulfuric acid pipe 312 and the hydrogen peroxide water pipe 322, respectively.

The mixture generation part 33 includes a mixing valve 331 to which the sulfuric acid pipe 312 and the hydrogen peroxide water pipe 322 are connected, a discharging pipe 332 connected to the mixing valve 331 and the processing liquid nozzle 34, and an agitator flow tube 333 provided on the discharging pipe 332. In the mixture generation part 33, the heated sulfuric acid supplied from the sulfuric acid supply part 31 and the hydrogen peroxide water of ordinary temperature (almost the same temperature as the room temperature) supplied from the hydrogen peroxide water supply part 32 are mixed in the mixing valve 331, to thereby generate an SPM liquid (sulfuric acid/hydrogen peroxide/water mixture) which is a mixed solution.

The SPM liquid goes through the agitator flow tube 333 and the discharging pipe 332 and is transferred to the processing liquid nozzle 34. In the agitator flow tube 333, the SPM liquid is agitated to accelerate the chemical reaction of the sulfuric acid contained in the SPM liquid and the hydrogen peroxide water. The SPM liquid serving as a processing liquid is discharged from an outlet at a front end of the processing liquid nozzle 34 toward the upper surface 91 of the substrate 9. In the first preferred embodiment, the sulfuric acid heated to about 130 to 150 degrees Celsius by the sulfuric acid heating part 315 is supplied from the sulfuric acid supply part 31 to the mixture generation part 33. The temperature of the sulfuric acid to be supplied from the sulfuric acid supply part 31 may be changed as appropriate.

As shown in FIG. 1, the anti-static liquid contacting part 7 includes an anti-static liquid storage part 71 for storing an anti-static liquid therein, an anti-static liquid supply part 72 for supplying the anti-static liquid to the anti-static liquid storage part 71, a cartridge 73 for holding a plurality of substrates 9, and a substrate drying part 75 for performing a vacuum drying process on the substrate 9. In FIG. 1, a cartridge moving part for holding and moving the cartridge 73 is not shown. In the anti-static liquid contacting part 7, deionized water (DIW) is used as the anti-static liquid.

Figure 3:
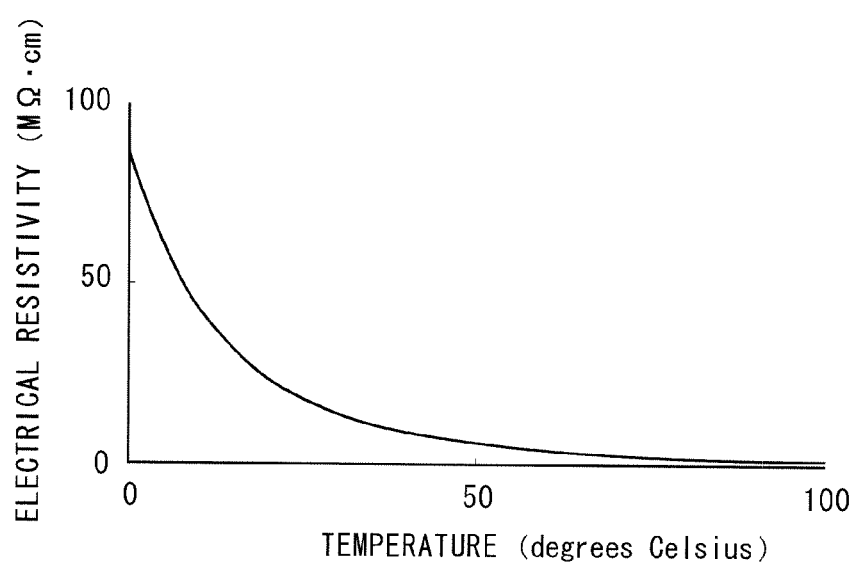
FIG. 3 is a graph showing a relation between a temperature of deionized water and electrical resistivity thereof.

FIG. 3 is a graph showing a relation between a temperature of deionized water and electrical resistivity thereof. As shown in FIG. 3, the electrical resistivity of deionized water gradually decreases as a liquid temperature increases. The electrical resistivity of deionized water is higher than electrical resistivity of the SPM liquid in all range not lower than the freezing point of deionized water and not higher than the boiling point thereof. The anti-static liquid used in the anti-static liquid contacting part 7 is not limited to deionized water but various kinds of liquid may be used as the anti-static liquid only if the electrical resistivity of the liquid gradually decreases as the liquid temperature increases. Further, the electrical resistivity of the anti-static liquid has only to be higher than the electrical resistivity of the processing liquid used in the single-substrate processing apparatus 1 at least in a predetermined temperature range not lower than the freezing point of the anti-static liquid and not higher than the boiling point thereof. As the anti-static liquid, for example, an ionic liquid such as carbon dioxide water ($CO_2$ water) in which carbon dioxide ($CO_2$) is dissolved in deionized water may be used. The same applies to the following preferred embodiments.

As shown in FIG. 1, the anti-static liquid supply part 72 includes an anti-static liquid pipe 721, a flowmeter 722, and an anti-static liquid valve 724. The anti-static liquid pipe 721 is connected to a not-shown anti-static liquid supply source. The anti-static liquid discharged from a front end of the anti-static liquid pipe 721 is supplied to the anti-static liquid storage part 71 and stored therein. On the anti-static liquid pipe 721, from the anti-static liquid supply source toward the anti-static liquid storage part 71, the flowmeter 722, the temperature adjustment part 61, the anti-static liquid valve 724, and the anti-static liquid measurement part 62 are arranged in this order. The flowmeter 722 measures the amount of flow of anti-static liquid flowing in the anti-static liquid pipe 721. The temperature adjustment part 61 heats or cools the anti-static liquid flowing in the anti-static liquid pipe 721 as necessary, to thereby adjust the temperature of the anti-static liquid in the anti-static liquid pipe 721. The anti-static liquid valve 724 adjusts the amount of flow of anti-static liquid flowing in the anti-static liquid pipe 721. The anti-static liquid measurement part 62 measures the temperature of the anti-static liquid flowing in the anti-static liquid pipe 721.

A measurement result (i.e., the temperature of the anti-static liquid) obtained by the anti-static liquid measurement part 62 is transferred to the control part 8. The control part 8 controls the single-substrate processing apparatus 1, the anti-static liquid contacting part 7, the temperature adjustment part 61, the anti-static liquid measurement part 62, and the like on the basis of the target temperature of the anti-static liquid stored in the storage part 8a, in other words, a desired temperature of the anti-static liquid used in the static elimination process discussed later. The target temperature of the anti-static liquid refers to a temperature required to achieve desired electrical resistivity (i.e., target electrical resistivity) of the anti-static liquid used in the static elimination process. The target electrical resistivity of the anti-static liquid is higher than the electrical resistivity of the processing liquid used by the single-substrate processing apparatus 1. The target temperature is obtained on the basis of the target electrical resistivity, the relation between the temperature of the anti-static liquid and the electrical resistivity thereof shown in FIG. 3, and the like. A specific method of obtaining the target temperature will be discussed later.

The target electrical resistivity is set higher as the size of a device which is formed on the upper surface 91 of the substrate 9 in advance is smaller (in other words, as the minimum width of a wiring line on the device is smaller). Therefore, the target temperature is set lower as the size of the device which is formed on the upper surface 91 of the substrate 9 in advance is smaller. In the first preferred embodiment, the target electrical resistivity is set in a range from about 1 to 18 MO·cm (megaohm-cm) and the target temperature is set in a range from about 25 to 100 degrees Celsius.

In the substrate processing apparatus 10, the temperature adjustment part 61 is feedback controlled by the control part 8 on the basis of the measurement result obtained by the anti-static liquid measurement part 62 and the above-discussed target temperature. In the temperature adjustment part 61, the temperature of the anti-static liquid is adjusted so that a difference between the temperature of the anti-static liquid in the anti-static liquid pipe 721 and the target temperature may become smaller. The temperature of the anti-static liquid to be supplied to the anti-static liquid storage part 71 is maintained at roughly the target temperature. In other words, by the above-discussed feedback control, the temperature of the anti-static liquid is maintained within a narrow temperature range which is substantially equal to the target temperature (naturally, the temperature range includes the target temperature).

In the substrate processing apparatus 10, there is a case where a temperature of the anti-static liquid which differs a little from the target temperature is acceptable. In such a case, when a difference between the temperature of the anti-static liquid which is obtained by the measurement of the anti-static liquid measurement part 62 and the target temperature is not larger than a threshold temperature difference, adjustment of the temperature of the anti-static liquid by the temperature adjustment part 61 is stopped by the control part 8, and only when the difference between the temperature of the anti-static liquid and the target temperature is larger than the threshold temperature difference, the adjustment of the temperature of the anti-static liquid by the temperature adjustment part 61 is performed. Assuming that the temperature which is lower than the target temperature by the threshold temperature difference is referred to as a "lower limit temperature" and the temperature which is higher than the target temperature by the threshold temperature difference is referred to as an "upper limit temperature", by the above-discussed temperature adjustment, the temperature of the anti-static liquid to be supplied to the anti-static liquid storage part 71 is roughly maintained within a range not lower than the lower limit temperature and not higher than the upper limit temperature. The electrical resistivity of the anti-static liquid at the upper limit temperature is higher than the electrical resistivity of the processing liquid used in the single-substrate processing apparatus 1.

Thus, in the anti-static liquid supply part 72, the control part 8 controls the temperature adjustment part 61 to adjust the temperature of the anti-static liquid within a range in which the electrical resistivity of the anti-static liquid is higher than the electrical resistivity of the above-discussed processing liquid.

In the anti-static liquid contacting part 7, a plurality of substrates 9 are held in the cartridge 73 disposed above the anti-static liquid storage part 71 while being arranged so that main surfaces thereof may be in parallel to one another. Then, the cartridge moving part moves the cartridge 73 downwardly and the plurality of substrates 9 are immersed in the anti-static liquid stored in the anti-static liquid storage part 71 while being arranged so that the directions of the normals of the respective main surfaces thereof are directed to a horizontal direction.

In the substrate drying part 75, a vacuum drying process is performed on the substrate (s) 9 after being immersed in the anti-static liquid. In the substrate drying part 75, the vacuum drying process may be performed on the plurality of substrates 9 held in the cartridge 73 or on the substrates 9 detached from the cartridge 73 one by one. Further, in the substrate drying part 75, various methods other than the vacuum drying process may be used to perform a drying process. The substrate 9 after being subjected to the vacuum drying process is loaded into the single-substrate processing apparatus 1. In FIG. 1, a transfer mechanism or the like for transferring the substrate 9 between the substrate drying part 75 and the single-substrate processing apparatus 1 is not shown.

Next, with reference to FIG. 4, discussion will be made on an operation flow for processing the substrate 9 in the substrate processing apparatus 10. First, the target temperature and the static elimination time corresponding to the substrate 9 to be used are read out from the storage part 8a and set into the control part 8 (Step S11). In the first preferred embodiment, the target temperature and the static elimination time are stored in the storage part 8a in advance, and read out from the storage part 8a and set into the control part 8 at the time when the substrate processing is started. There may be another case, however, where the target temperature and the static elimination time are not stored in the storage part 8a and an operator sets these temperature and time into the control part 8 by using a not-shown input part every time when the substrate processing is started.

Further, instead of storing the target temperature into the storage part 8a, a table indicating a relation between the size of a device on the substrate 9 and the target temperature of the anti-static liquid may be stored in the storage part 8a in advance. In such a case, before the processing of the substrate 9 is started, a size of the device on the substrate 9 to be processed is inputted to the storage part 8a, the target temperature corresponding to the substrate 9 is next determined on the basis of the size of the device and the above table, and finally the target temperature is set into the control part 8. As for determination of the target temperature and the static elimination time and setting of these temperature and time into the control part 8 (alternatively, as for determination of the target electrical resistivity and setting of the same discussed later), the same applies to other substrate processing apparatuses discussed later.

Subsequently, the cartridge 73 holding a plurality of substrates 9 is loaded into the substrate processing apparatus 10. Before being loaded into the substrate processing apparatus 10, each of the substrates 9 is subjected to a drying process such as dry etching, plasma CVD (Chemical Vapor Deposition), or the like, and the substrate 9 is thereby electrically charged.

In the anti-static liquid contacting part 7, with the front end of the anti-static liquid pipe 721 directed to a position out of the anti-static liquid storage part 71, the control part 8 opens the anti-static liquid valve 724 and the anti-static liquid pipe 721 starts discharge of the anti-static liquid (deionized water). Then, the temperature adjustment part 61 is feedback controlled on the basis of the measurement result obtained by the anti-static liquid measurement part 62, i.e., the temperature of the anti-static liquid, and the above-discussed target temperature. The temperature of the anti-static liquid is thereby adjusted to be within a temperature range in which the electrical resistivity of the anti-static liquid is higher than the electrical resistivity of the processing liquid (SPM liquid) used in the single-substrate processing apparatus 1 (Step S12).

Figure 5:
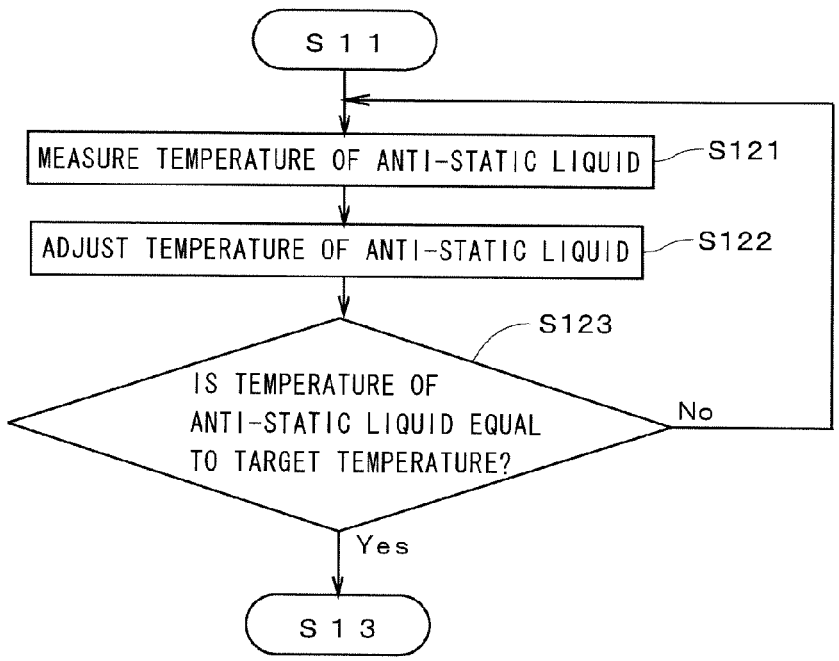
FIGS. 5 and 6 are flowcharts each showing a partial operation flow for processing a substrate.

FIG. 5 is a flowchart showing an operation flow for performing a temperature adjustment (Step S12) of the anti-static liquid. First, the anti-static liquid measurement part 62 measures the temperature of the anti-static liquid flowing in the anti-static liquid pipe 721 (Step S121). Subsequently, on the basis of a measurement result obtained in Step S121, the temperature of the anti-static liquid is adjusted by the temperature adjustment part 61 so that a difference between the temperature of the anti-static liquid flowing in the anti-static liquid pipe 721 and the target temperature may become smaller (Step S122). Then, by repeating Steps S121 and S122, the temperature of the anti-static liquid is adjusted to and maintained at roughly the target temperature (Step S123).

Figure 6:
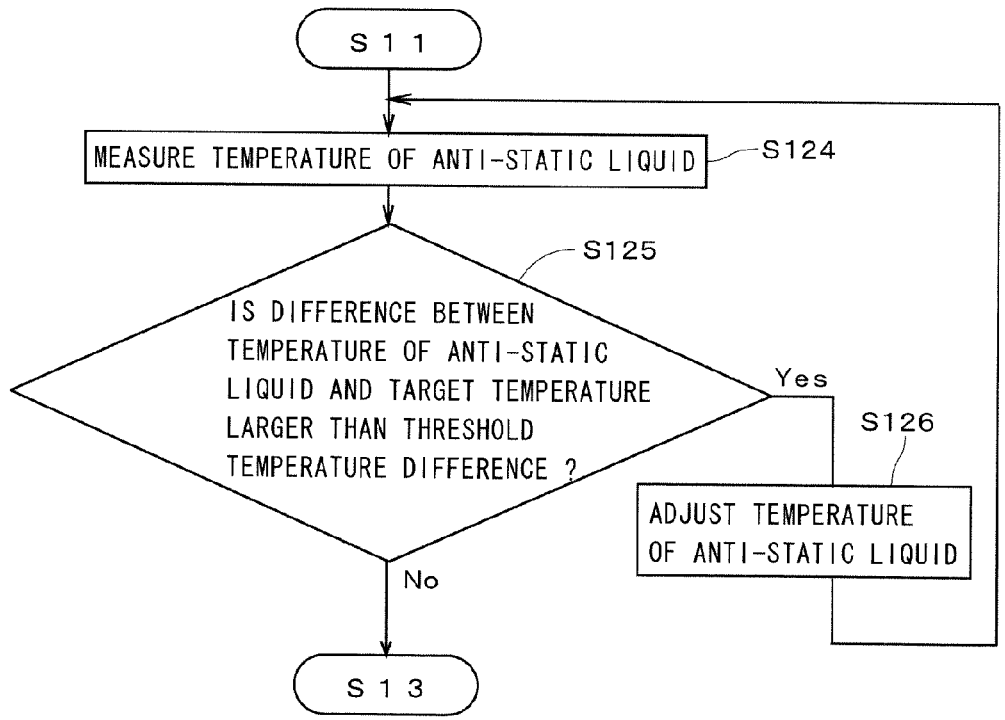

In the case, as discussed above, where the temperature of the anti-static liquid which differs a little from the target temperature is acceptable, instead of Steps S121 to S123 in FIG. 5, the temperature adjustment shown in FIG. 6 is performed. First, the anti-static liquid measurement part 62 measures the temperature of the anti-static liquid flowing in the anti-static liquid pipe 721 (Step S124). Subsequently, on the basis of a measurement result obtained in Step S124, a difference between the temperature of the anti-static liquid flowing in the anti-static liquid pipe 721 and the target temperature is obtained and then compared with the above-discussed threshold temperature difference (Step S125).

When the difference between the temperature of the anti-static liquid and the target temperature is not larger than the threshold temperature difference, the temperature adjustment of the anti-static liquid by the temperature adjustment part 61 is not performed. When the difference between the temperature of the anti-static liquid and the target temperature is larger than the threshold temperature difference, the temperature of the anti-static liquid is adjusted by the temperature adjustment part 61 so that the difference between the temperature of the anti-static liquid and the target temperature may become smaller (Step S126). Then, by repeating Steps S124 to S126, the temperature of the anti-static liquid is adjusted and maintained roughly within the temperature range not lower than the lower limit temperature lower than the target temperature by the threshold temperature difference and not higher than the upper limit temperature higher than the target temperature by the threshold temperature difference.

After the temperature adjustment of the anti-static liquid is finished, the front end of the anti-static liquid pipe 721 is directed toward the anti-static liquid storage part 71, and the anti-static liquid is supplied from the anti-static liquid supply part 72 to the anti-static liquid storage part 71 by a predetermined amount and stored therein (Step S13). The anti-static liquid contacting part 7 may further include an auxiliary measurement part for measuring a temperature of the anti-static liquid in the anti-static liquid storage part 71 and an auxiliary adjustment part for adjusting the temperature of the anti-static liquid in the anti-static liquid storage part 71. In such a case, the auxiliary adjustment part is controlled on the basis of a measurement result obtained by the auxiliary measurement part, to heat or cool the anti-static liquid as necessary so that the anti-static liquid in the anti-static liquid storage part 71 may have a desired temperature (for example, the target temperature).

After that, the cartridge moving part is controlled by the control part 8 to move the cartridge 73 disposed above the anti-static liquid storage part 71 downwardly toward the anti-static liquid storage part 71. Then, the plurality of substrates 9 held in the cartridge 73 are immersed in the anti-static liquid inside the anti-static liquid storage part 71. Each of the substrates 9 is gradually immersed into the anti-static liquid from the lower portion of an edge thereof in a state of being held in the cartridge 73, and when the whole substrate 9 is immersed, both of the main surfaces of the substrate 9 entirely come into contact with the anti-static liquid. Further, the anti-static liquid being in contact with one of the main surfaces of the substrate 9 and the anti-static liquid being in contact with the other main surface are continuous with each other on the edge of the substrate 9.

In the substrate 9, assuming that a main surface on which a device is formed is referred to as a "first main surface" and the other main surface is referred to as a "second main surface", by immersing the substrate 9 into the anti-static liquid, the first main surface and the second main surface entirely come into contact with the anti-static liquid. The anti-static liquid being in contact with the first main surface and the anti-static liquid being in contact with the second main surface arc continuous with each other on the edge of the substrate 9. Thus, by bringing the substrate 9 into contact with the anti-static liquid, the electric charges on the substrate 9 are relatively gently moved to the anti-static liquid. In the substrate processing apparatus 10, the state in which the substrate 9 is in contact with the anti-static liquid is kept for a predetermined time period, and the amount of electric charges on the substrate 9 thereby decreases without giving any damage to the device formed on the substrate 9. In other words, a static elimination process for the substrate 9 is thus performed (Step S14).

Figure 7:
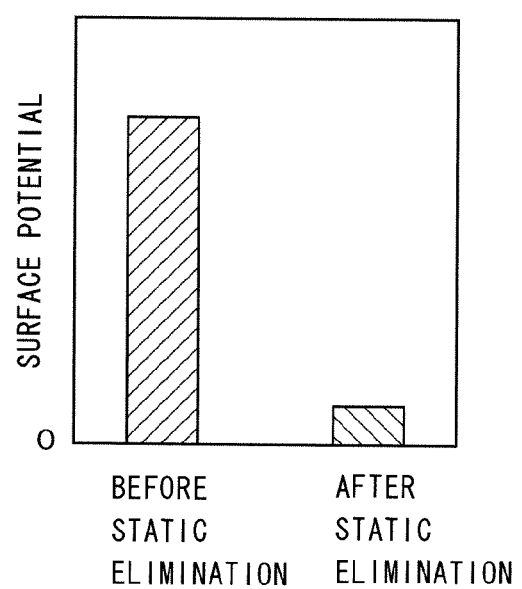
FIG. 7 is a graph showing respective surface potentials of the substrate before and after a static elimination process.

FIG. 7 is a graph showing respective surface potentials on the upper surface 91 of the substrate 9 before and after the static elimination process in the substrate processing apparatus 10. FIG. 7 shows respective absolute values of the surface potentials at a center portion of the substrate 9 (the same applies to FIGS. 13 and 17). By performing the above-discussed static elimination process, the amount of electric charges on the substrate 9 decreases and the potential of the substrate 9 is reduced on the whole. In the substrate processing apparatus 10, when the size of the device formed on the substrate 9 is relatively small, the temperature of the anti-static liquid is maintained, for example, at about 25 degrees Celsius and the electrical resistivity of the anti-static liquid is about 18 MO·cm. Further, when the size of the device formed on the substrate 9 is relatively large (in other words, the resistance to the damage due to the movement of the electric charges is relatively high), the temperature of the anti-static liquid is maintained, for example, at a temperature slightly lower than 100 degrees Celsius and the electrical resistivity of the anti-static liquid is about 1 MO·cm. Thus, by making the temperature of the anti-static liquid higher and making the electrical resistivity thereof relatively lower, the movement speed of the electric charges from the substrate 9 to the anti-static liquid increases. As a result, it is possible to reduce the time required to perform the static elimination process on the substrate 9.

After the static elimination process on the substrate 9 is finished, the control part 8 controls the substrate drying part 75 to perform the vacuum drying process on the substrate 9, to thereby remove the anti-static liquid from the entire upper surface 91 and the entire lower surface 92 of the substrate 9 (Step S15). In other words, the substrate drying part 75 is the liquid removing part for removing a liquid from the upper surface 91 and the lower surface 92 of the substrate 9. Subsequently, one substrate 9 is loaded into the single-substrate processing apparatus 1 shown in FIG. 2 and held by the substrate holding part 2 with the upper surface 91 thereof directed upward. Next, the control part 8 controls the substrate rotating mechanism 42 to start rotation of the substrate 9 (Step S16). Further, the processing liquid nozzle rotating mechanism 35 starts rotation of the processing liquid nozzle 34 and the processing liquid nozzle 34 thereby repeats reciprocating motion between the center portion of the substrate 9 and the edge thereof.

Next, the control part 8 controls the processing liquid supply part 3 to open the sulfuric acid valve 314 of the sulfuric acid supply part 31, and the sulfuric acid heated by the sulfuric acid heating part 315 up to about 130 to 150 degrees Celsius is thereby supplied to the mixing valve 331 of the mixture generation part 33 through the sulfuric acid pipe 312. Further, the control part 8 opens the hydrogen peroxide water valve 324 and the hydrogen peroxide water of room temperature is thereby supplied from the hydrogen peroxide water storage part 321 to the mixing valve 331 through the hydrogen peroxide water pipe 322. In the mixing valve 331, the heated sulfuric acid and the hydrogen peroxide water of room temperature are mixed to generate the SPM liquid. The temperature of the SPM liquid is increased to, e.g., about 150 to 195 degrees Celsius which is higher than the temperature of the sulfuric acid supplied from the sulfuric acid supply part 31, by the reaction of the sulfuric acid and the hydrogen peroxide water.

The SPM liquid goes through the discharging pipe 332 and the agitator flow tube 333 and is supplied from the processing liquid nozzle 34 onto the upper surface 91 of the substrate 9. In other words, the processing liquid supply part 3 supplies the heated sulfuric acid and the hydrogen peroxide water while being mixed, onto the upper surface 91 of the substrate 9. With the rotation of the substrate 9, the SPM liquid spreads over the entire upper surface 91 of the substrate 9 and is scattered out of the edge of the substrate 9 and received by the cup part 41. In the single-substrate processing apparatus 1, the SPM liquid is continuously supplied onto the substrate 9 for a predetermined time period, and the SPM process for the substrate 9, i.e., a process of removing the resist film on the substrate 9 with a strong oxidizing power of Caro's acid contained in the SPM liquid is performed (Step S17). Further, in the single-substrate processing apparatus 1, the SPM liquid or the like may be supplied from the processing liquid nozzle 34 which stays still above the center portion of the substrate 9.

After the SPM process is finished, the sulfuric acid valve 314 is closed while the hydrogen peroxide water valve 324 remains open, and the hydrogen peroxide water goes through the mixing valve 331, the discharging pipe 332, and the agitator flow tube 333 and is supplied from the processing liquid nozzle 34 onto the substrate 9 from which the resist film is removed (Step S18). By performing the hydrogen peroxide water supplying process, the SPM liquid which remains in the mixing valve 331, the discharging pipe 332, the agitator flow tube 333, and the processing liquid nozzle 34 is removed. With the rotation of the substrate 9, the hydrogen peroxide water supplied onto the substrate 9 spreads over the entire upper surface 91 of the substrate 9 and the SPM liquid remaining on the substrate 9 is thereby pushed out of the edge of the substrate 9 and removed therefrom.

After the hydrogen peroxide water supplying process is finished, the hydrogen peroxide water valve 324 is closed to stop the supply of the hydrogen peroxide water, and the processing liquid nozzle rotating mechanism 35 moves the processing liquid nozzle 34 to a waiting position outside the substrate 9. Next, a rinse process is performed, in which a rinse liquid is supplied from a not-shown rinse liquid supply part onto the upper surface 91 of the substrate 9 (Step S19). As the rinse liquid, for example, deionized water or the carbon dioxide water ($CO_2$ water) is used. With the rotation of the substrate 9, the rinse liquid spreads over the entire upper surface 91 of the substrate 9. The hydrogen peroxide water remaining on the substrate 9 is thereby rinsed out. After the rinse process is continuously performed for a predetermined time period, the supply of the rinse liquid is stopped. Then, the number of rotations of the substrate 9 is increased, and a drying process for removing the rinse liquid remaining on the substrate 9 with the rotation of the substrate 9 is performed (Step S20). After that, the rotation of the substrate 9 is stopped (Step S21), and the substrate 9 is unloaded from the substrate processing apparatus 10.

As discussed above, in the substrate processing apparatus 10, before the processing using the processing liquid (i.e., the SPM process using the SPM liquid) is performed in the single-substrate processing apparatus 1, both of the main surfaces of the substrate 9 which is electrically charged by the preprocessing such as dry etching, plasma CVD, or the like are entirely brought into contact with anti-static liquid having electrical resistivity higher than that of the SPM liquid and kept wetted (i.e., maintained the wafted state). From both the entire main surfaces of the substrate 9, static electricity is thereby relatively gently removed. Since there arises no heat generation due to rapid movement of the electric charges from the substrate 9 to the anti-static liquid in the static elimination, it is possible to prevent any damage to the device formed on the substrate 9.

Then, since the above processing liquid is supplied onto the substrate 9 from which static electricity is removed, there arises no rapid movement of a large amount of electric charges from the substrate 9 to the processing liquid even when the substrate 9 is brought into contact with the processing liquid having electrical resistivity lower than that of the anti-static liquid. It is therefore possible to prevent any damage to the device. i.e., any damage to the substrate 9, due to the movement of the electric charges also in the processing using the processing liquid in the single-substrate processing apparatus 1.

In the substrate processing apparatus 10, by adjusting the temperature of the anti-static liquid by the temperature adjustment part 61, both the main surfaces of the substrate 9 is brought into contact with the anti-static liquid while the electrical resistivity of the anti-static liquid is maintained higher than that of the processing liquid used in the single-substrate processing apparatus 1. It is thereby possible to perform the static elimination process on the substrate 9 without giving any damage to the device, as discussed above. Further, since the temperature of the anti-static liquid is made higher and the electrical resistivity thereof is made lower within the range in which no damage is given to the device, it is possible to increase the movement speed of the electric charges from the substrate 9 to the anti-static liquid. As a result, it is possible to reduce the time required to perform the static elimination process on the substrate 9.

The electrical resistivity of the anti-static liquid may be also adjusted by using, for example, an ionic liquid in which carbon dioxide ($CO_2$) or the like is dissolved in deionized water as the anti-static liquid and controlling the ion concentration of the anti-static liquid. There is a possibility, however, that this method may increase the cost required for the static elimination process since carbon dioxide or the like is used. Further, the electrical resistivity of the anti-static liquid cannot be made higher, as compared with the electrical resistivity of deionized water at the same temperature. In contrast to this, in the above-discussed substrate processing apparatus 10, since the electrical resistivity of the anti-static liquid is adjusted by controlling the temperature of the anti-static liquid, it is possible to easily adjust the electrical resistivity of the anti-static liquid at low cost.

As discussed above, in the substrate processing apparatus 10, lower temperature is determined as the target temperature of the anti-static liquid and higher electrical resistivity is determined as the target electrical resistivity thereof as the size of the device formed on the substrate 9 is smaller. It is thereby possible to both prevent any damage to the substrate 9 in the processing by the single-substrate processing apparatus 1 and reduce the time required for the static elimination process appropriately in accordance with the size of the device.

In the anti-static liquid contacting part 7, the anti-static liquid being in contact with one of the main surfaces of the substrate 9 and the anti-static liquid being in contact with the other main surface are continuous with each other on the edge of the substrate 9. It is thereby possible to reduce (the absolute value of) the surface potential of the substrate 9 by the static elimination process as compared with a case where the anti-static liquid being in contact with one of the main surfaces of the substrate 9 and the anti-static liquid being in contact with the other main surface are not continuous with each other.

In the anti-static liquid contacting part 7, since the whole of the substrate 9 is immersed in the anti-static liquid, it is possible to easily make the anti-static liquid being in contact with one of the main surfaces of the substrate 9 and the anti-static liquid being in contact with the other main surface continuous with each other. Further, since the amount of anti-static liquid to be brought into contact with the substrate 9 per unit area can be easily increased, it is possible to further reduce (the absolute value of) the surface potential of the substrate 9.

In the anti-static liquid contacting part 7, since a plurality of substrates 9 are immersed in the anti-static liquid inside the anti-static liquid storage part 71 at a time as discussed above, the static elimination process on the plurality of substrates 9 can be performed with high efficiency. Further, since it is not necessary to frequently supply the anti-static liquid into the anti-static liquid storage part 71, it is possible to suppress generation of electric charges in the anti-static liquid by friction between the anti-static liquid and the anti-static liquid pipe 721. Furthermore, since each of the substrates 9 is gradually immersed from the edge thereof, even if damage is caused to the substrate 9 by the movement of the electric charges from the substrate 9 to the anti-static liquid, the damage is caused only to the edge of the substrate 9 and its vicinity where little effect is produced on the device formed on the substrate 9. Therefore, it is possible to increase the yield of the device.

In the anti-static liquid contacting part 7, by performing the temperature adjustment shown in the above Steps S121 to S123, the temperature of the anti-static liquid can be adjusted with high accuracy. Further, in the case where the temperature adjustment shown in Steps S124 to S126 is performed, it is possible to simplify the control of the temperature adjustment part 61 by the control part 8 as compared with the case where the temperature adjustment shown in Steps S121 to S123 is performed.

As discussed above, in the anti-static liquid contacting part 7, deionized water is used as the anti-static liquid. It is thereby possible to reduce the cost required to use the anti-static liquid as compared with the case where the ionic liquid in which carbon dioxide ($CO_2$) or the like is dissolved in deionized water is used as the anti-static liquid.

In the substrate processing apparatus 10, between the static elimination process in Step S14 and the processing (SPM process) using the processing liquid in Step S17, the anti-static liquid is removed from the substrate 9 by the drying process in Step S15. It is thereby possible to prevent any adverse effects due to the mixture of the anti-static liquid and the processing liquid on the substrate 9. As the adverse effects, there are, for example, damage (so-called heat shock) to the substrate 9 due to the heat of reaction between deionized water serving as the anti-static liquid and the sulfuric acid contained in the SPM liquid, deterioration in the quality of the SPM process due to the dilution of the SPM liquid with the anti-static liquid, and deterioration in the uniformity of the SPM process over the entire substrate 9 due to the ununiformity in the concentration of the SPM liquid which is caused by the partial mixture of the SPM liquid and the anti-static liquid.

Figure 4:
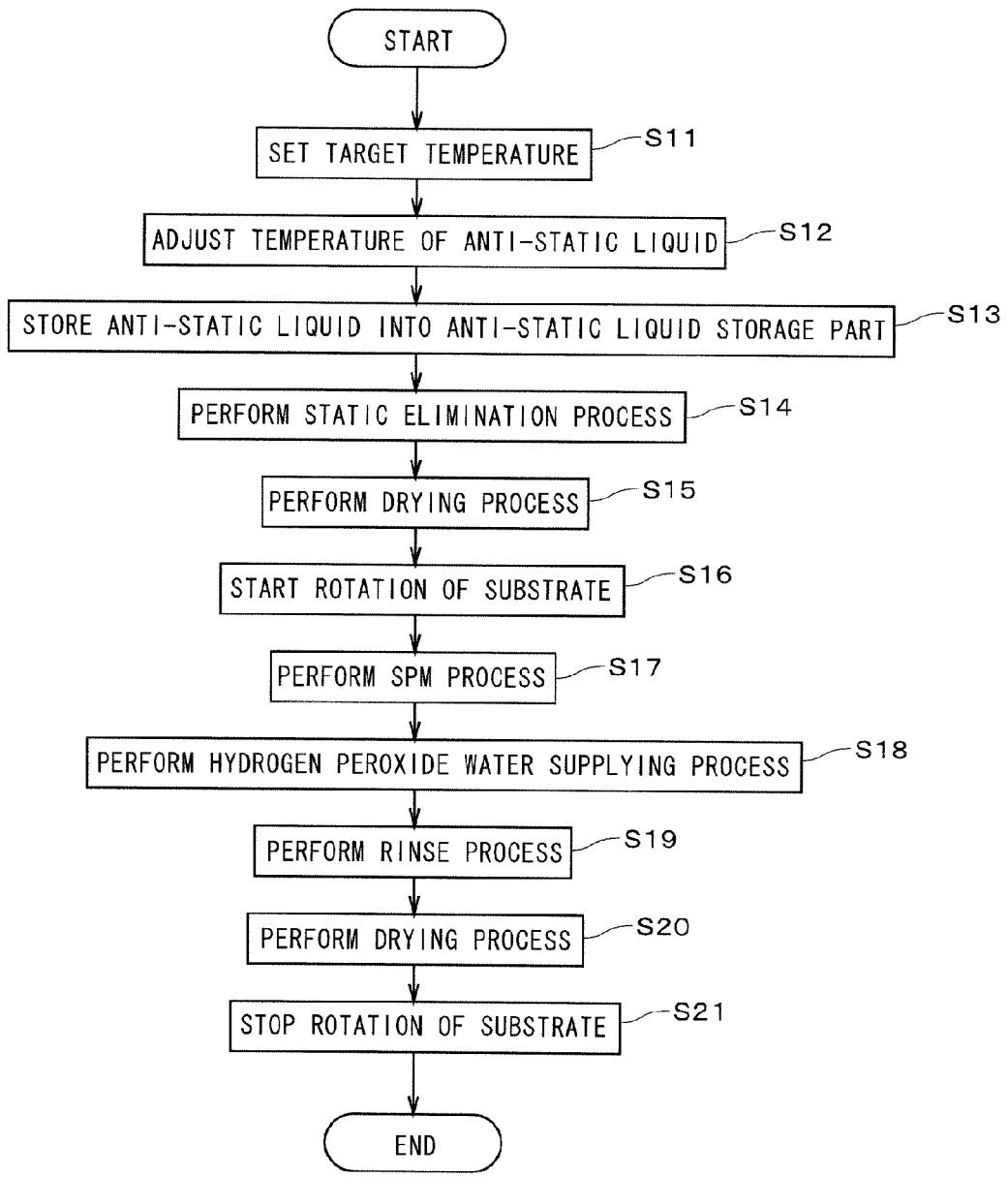
FIG. 4 is a flowchart showing an operation flow for processing a substrate.
Figure 8A:
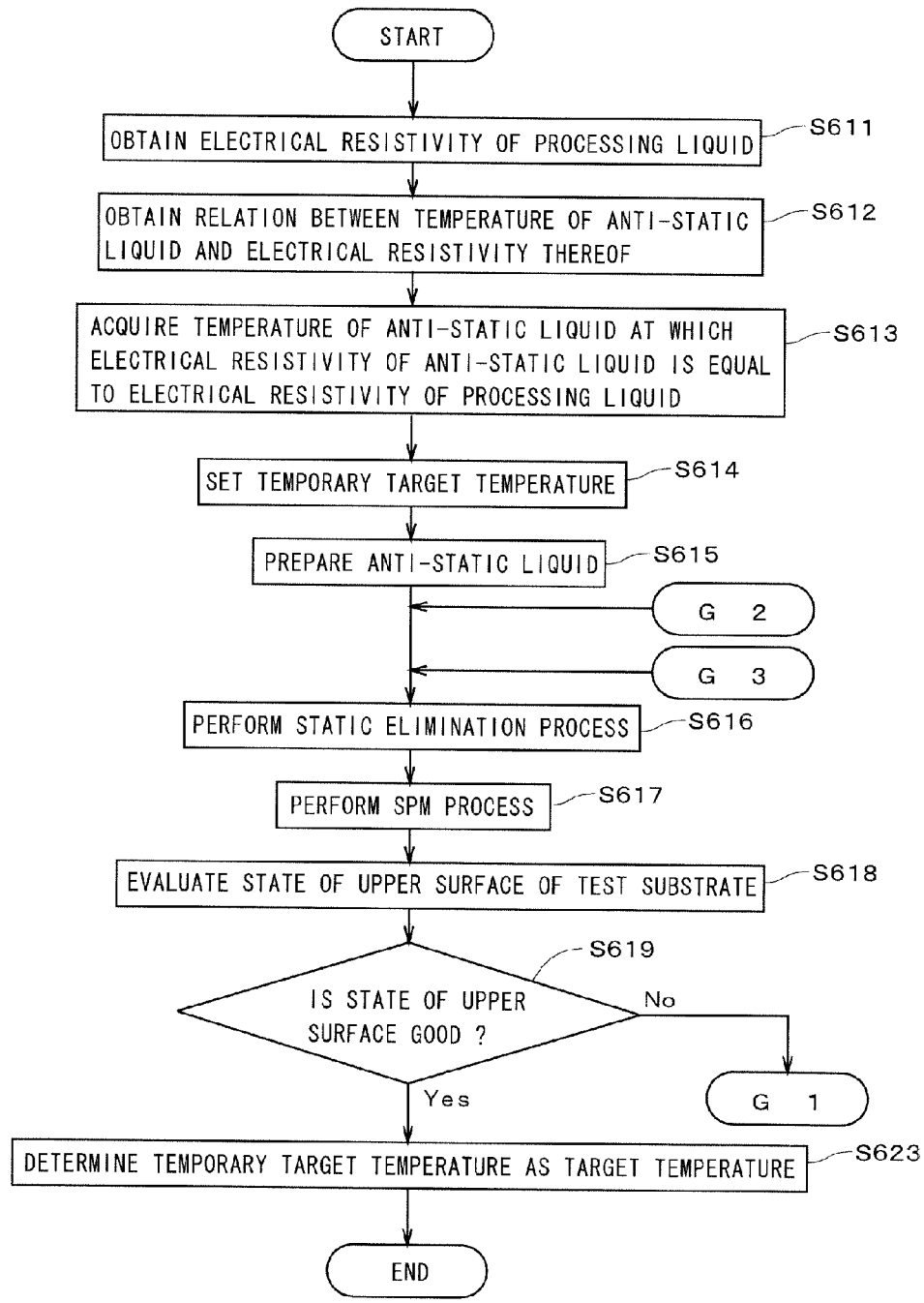
FIGS. 8A and 8B are flowcharts showing an operation flow for determining a target temperature.
Figure 8B:
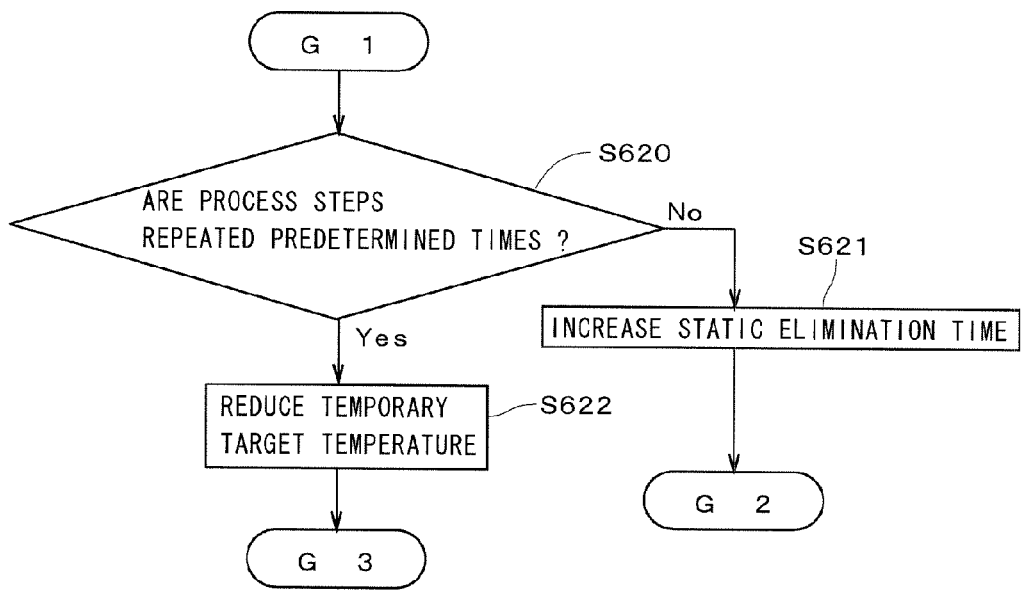

FIGS. 8A and 8B are flowcharts showing an exemplary operation flow for determining the target temperature to be set into the control part 8 in Step S11 of FIG. 4. In a process for determining the target temperature, first, the electrical resistivity of the processing liquid (SPM liquid) to be used in Step S17 is measured and obtained (Step S611). Subsequently, the relation between the temperature of the anti-static liquid (deionized water) and the electrical resistivity thereof is obtained (Step S612). Then, on the basis of the relation obtained in Step S612, acquired is the temperature of the anti-static liquid at which the electrical resistivity of the anti-static liquid is equal to that of the processing liquid (Step S613).

Next, a temporary target temperature which is slightly lower than the temperature acquired in Step S613 is set and an anti-static liquid at the temporary target temperature is prepared (Steps S614 and S615). Concurrently with the preparation of the anti-static liquid, a test substrate having the same structure as the above-discussed substrate 9 is prepared. The test substrate is immersed in the anti-static liquid at the temporary target temperature which is stored in an anti-static liquid storage part. Both main surfaces of the test substrate are thereby entirely brought into contact with the anti-static liquid and the state (wetted state) in which the test substrate is in contact with the anti-static liquid is maintained for a predetermined time period, and the amount of electric charges on the test substrate thereby decreases. In other words, a static elimination process for the test substrate is thus performed (Step S616).

After the static elimination process is finished, the test substrate is taken out from the anti-static liquid and the drying process is performed thereon, and the anti-static liquid is thereby removed from both the surfaces of the test substrate. Subsequently, the processing liquid is supplied onto an upper surface (on which a device is formed in advance) of the test substrate, and a predetermined processing (SPM process) is performed like in Step S17 (Step S617).

After the SPM process is finished, the state of the upper surface of the test substrate is evaluated by observation or the like (Step S618), and when the state of the upper surface is good (Step S619), the temporary target temperature is determined as the target temperature. The target temperature is stored in the storage part 8a (Step S623). In Step S619, when there is no damage to the device on the upper surface of the test substrate, the state of the upper surface is evaluated to be good, and when there is damage to the device, the state of the upper surface is evaluated to be not good.

When the state of the upper surface of the test substrate is not good (Step S619), the time period required for the static elimination process (i.e., the time period for which the wetted state in which the test substrate is in contact with the anti-static liquid is maintained) in Step S616 is changed to be longer, and the static elimination process is performed on a new test substrate (Steps S620, S621, and S616). Then, the SPM process and the evaluation of the state of the upper surface of the test substrate are performed (Steps S617 and S618). The static elimination process with the time period therefor changed, the SPM process, and the evaluation of the test substrate are repeated predetermined times (Steps S619 to S621). When the state of the upper surface of the test substrate, however, is determined to be good before the repeat of these processings predetermined times is completed, the temporary target temperature is determined as the target temperature, and the time period for the static elimination process in Step S616 of the last operation is determined as the time period for the static elimination process in Step S14. This static elimination time is stored in the storage part 8a (Step S623).

On the other hand, when the state of the upper surface of the test substrate is not determined to be good even after the repeat of these processings predetermined times is completed, the temporary target temperature is reduced (Steps S619, S620, and S622). In other words, a temperature lower than the last temporary target temperature is set as the temporary target temperature. Then, for a new test substrate, the static elimination process, the SPM process, and the evaluation of the test substrate are performed (Steps S616 to S618). When the state of the upper surface of the test substrate becomes good, the temporary target temperature is determined as the target temperature (Steps S619 and S623). Further, when the state of the upper surface of the test substrate is not good, the static elimination time is changed to be longer (Steps S619 to S621), and then the static elimination process, the SPM process, and the evaluation of the test substrate are repeated predetermined times (Steps S616 to S621).

Thus, by repeating Steps S616 to S622, the temporary target temperature and the static elimination time at/for which the state of the upper surface of the test substrate after the SPM process is good are determined as the target temperature and the static elimination time, respectively (Step S623). Then, in the substrate processing apparatus 10, by performing the static elimination process using the anti-static liquid at the target temperature, it is possible to prevent any damage to the substrate 9 in the processing using the processing liquid. Further, by performing the static elimination process for the static elimination time which is thus set, it is possible to prevent the static elimination time from becoming too long.

Furthermore, in this process for determining a target static elimination temperature, a temperature which is slightly lower than the temperature of the anti-static liquid at which the electrical resistivity of the anti-static liquid is equal to that of the processing liquid is determined as the temporary target temperature at a starting point of the process for obtaining the target static elimination temperature (Step S614), and the temporary target temperature is gradually reduced (Step S622) and the temporary target temperature at the time when the state of the upper surface of the test substrate becomes good is determined as the final target temperature (Step S622). Since the static elimination time can be made shorter as the temperature of the anti-static liquid is higher, it is possible to determine the temperature at which the static elimination time is the shortest, among the temperature range in which no damage is given to the upper surface of the test substrate, as the final target temperature.

Figure 9:
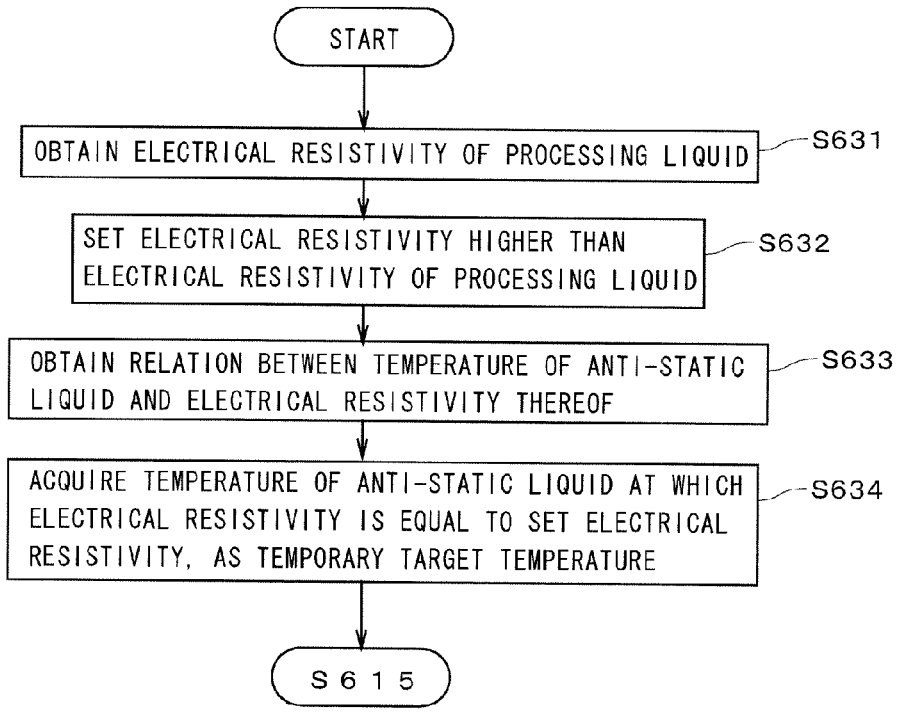
FIG. 9 is a flowchart showing a partial operation flow for determining the target temperature.

FIG. 9 is a flowchart showing another operation flow for determining the target temperature. FIG. 9 shows a partial operation flow for determining the target temperature. First, the electrical resistivity of the processing liquid (SPM liquid) to be used in Step S17 is measured and obtained (Step S631). Subsequently, electrical resistivity which is slightly higher than the electrical resistivity of the processing liquid is set as the temporary target electrical resistivity (Step S632). Further, the relation between the temperature of the anti-static liquid (deionized water) and the electrical resistivity thereof shown in FIG. 3 is also obtained (Step S633). Then, on the basis of the relation obtained in Step S633, the temperature of the anti-static liquid at which the electrical resistivity of the anti-static liquid is equal to the electrical resistivity set in Step S632 is acquired as the temporary target temperature (Step S634).

Hereinafter, the same process steps as the above Steps S615 to S623 are performed, and the temporary target temperature and the static elimination time at/for which the state of the upper surface of the test substrate after the SPM process is good are determined as the target temperature and the static elimination time, respectively. Then, in the substrate processing apparatus 10, by performing the static elimination process using the anti-static liquid at the target temperature, it is possible to prevent any damage to the substrate 9 in the processing using the processing liquid. Further, by performing the static elimination process for the static elimination time which is thus set, it is possible to prevent the static elimination time from becoming too long. The processes for determining the target temperature shown in FIGS. 8A, 8B, and 9 may be performed in the substrate processing apparatus 10 or may be performed without using the substrate processing apparatus 10.

Figure 10:
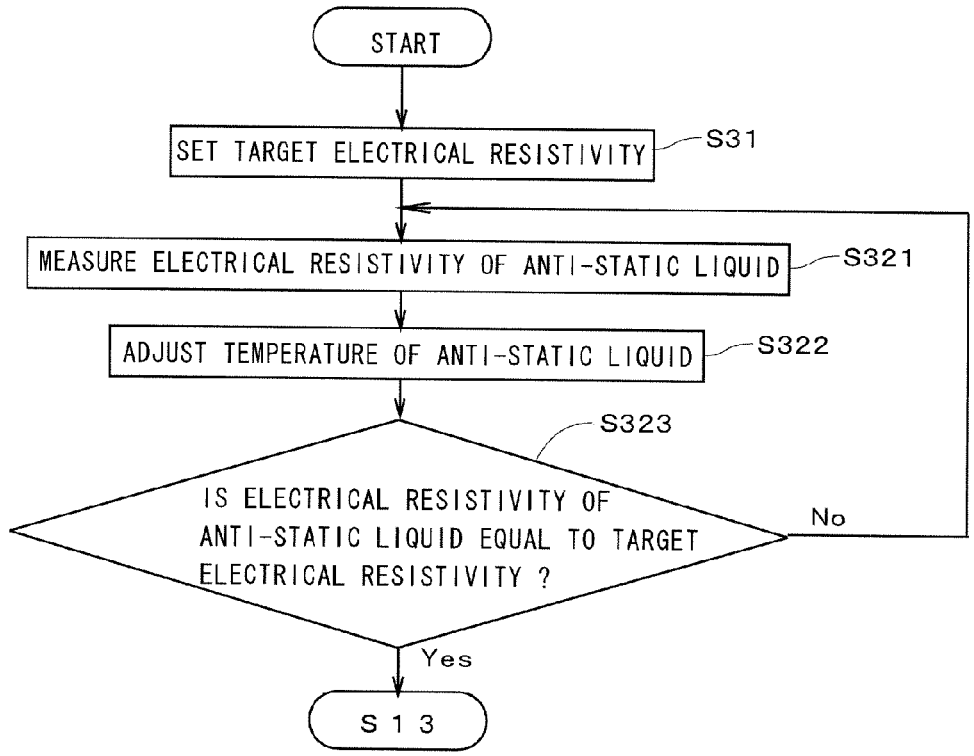
FIGS. 10 and 11 are flowcharts each showing a partial operation flow for processing a substrate.

In the substrate processing apparatus 10 shown in FIG. 1, there may be another case where an electrical resistivity meter is used as the anti-static liquid measurement part 62 and the electrical resistivity of the anti-static liquid is measured by the anti-static liquid measurement part 62. In such a case, in the substrate processing apparatus 10, instead of Step S11 of FIG. 4, target electrical resistivity which is desired electrical resistivity of the anti-static liquid used in the static elimination process is set into the control part 8 as shown in FIG. 10 (Step S31). Further, the relation between the temperature of the anti-static liquid and the electrical resistivity thereof shown in FIG. 3 is also stored in the control part 8.

Subsequently, instead of Steps S121 to S123 of FIG. 5, the anti-static liquid measurement part 62 measures the electrical resistivity of the anti-static liquid flowing in the anti-static liquid pipe 721 (Step S321). Next, on the basis of a measurement result obtained in Step S321 and the relation between the temperature of the anti-static liquid and the electrical resistivity thereof, the temperature of the anti-static liquid is adjusted by the temperature adjustment part 61 so that a difference between the electrical resistivity of the anti-static liquid in the anti-static liquid pipe 721 and the target electrical resistivity may become smaller (Step S322). Then, by repeating Steps S321 and S322, the electrical resistivity of the anti-static liquid is adjusted to and maintained at roughly the target electrical resistivity (Step S323). The electrical resistivity of the anti-static liquid can be thereby adjusted with high accuracy.

Figure 11:
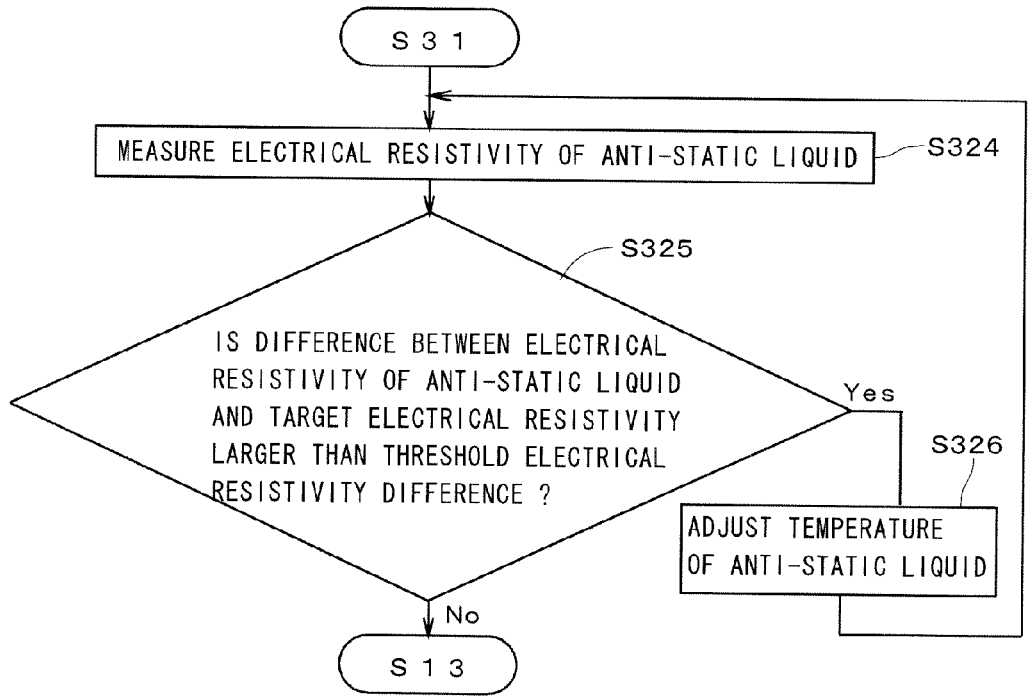

In a case where the electrical resistivity of the anti-static liquid which differs a little from the target electrical resistivity is acceptable, instead of Steps S321 to S323 in FIG. 10, the temperature adjustment shown in FIG. 11 is performed. First, the anti-static liquid measurement part 62 measures the electrical resistivity of the anti-static liquid flowing in the anti-static liquid pipe 721 (Step S324). Subsequently, on the basis of a measurement result obtained in Step S324, a difference between the electrical resistivity of the anti-static liquid flowing in the anti-static liquid pipe 721 and the target electrical resistivity is obtained and then compared with a predetermined threshold electrical resistivity difference which is set in advance (Step S325).

When the difference between the electrical resistivity of the anti-static liquid and the target electrical resistivity is not larger than the threshold electrical resistivity difference, the temperature adjustment of the anti-static liquid by the temperature adjustment part 61 is not performed. When the difference between the electrical resistivity of the anti-static liquid and the target electrical resistivity is larger than the threshold electrical resistivity difference, the temperature of the anti-static liquid is adjusted by the temperature adjustment part 61 so that the difference between the electrical resistivity of the anti-static liquid and the target electrical resistivity may become smaller (Step S326). Assuming that the electrical resistivity which is lower than the target electrical resistivity by the threshold electrical resistivity difference is referred to as a "lower limit electrical resistivity" and the electrical resistivity which is higher than the target electrical resistivity by the threshold electrical resistivity difference is referred to as an "upper limit electrical resistivity", by repeating Steps S324 to S326, the electrical resistivity of the anti-static liquid is adjusted and maintained roughly within the range not lower than the lower limit electrical resistivity and not higher than the upper limit electrical resistivity. It is thereby possible to simplify the control of the temperature adjustment part 61 by the control part 8 as compared with the case where the temperature adjustment shown in Steps S321 to S323 is performed.

In the substrate processing apparatus 10, in the case where the above Steps S31 and S321 to S323 are executed, the target electrical resistivity of the anti-static liquid is set higher as the size of the device formed on the substrate 9 is smaller. It is thereby possible to both prevent any damage to the substrate 9 in the processing by the single-substrate processing apparatus 1 and reduce the time required for the static elimination process appropriately in accordance with the size of the device. Further, the same applies to the case where Steps S31 and S324 to S326 are executed.

Figure 12:
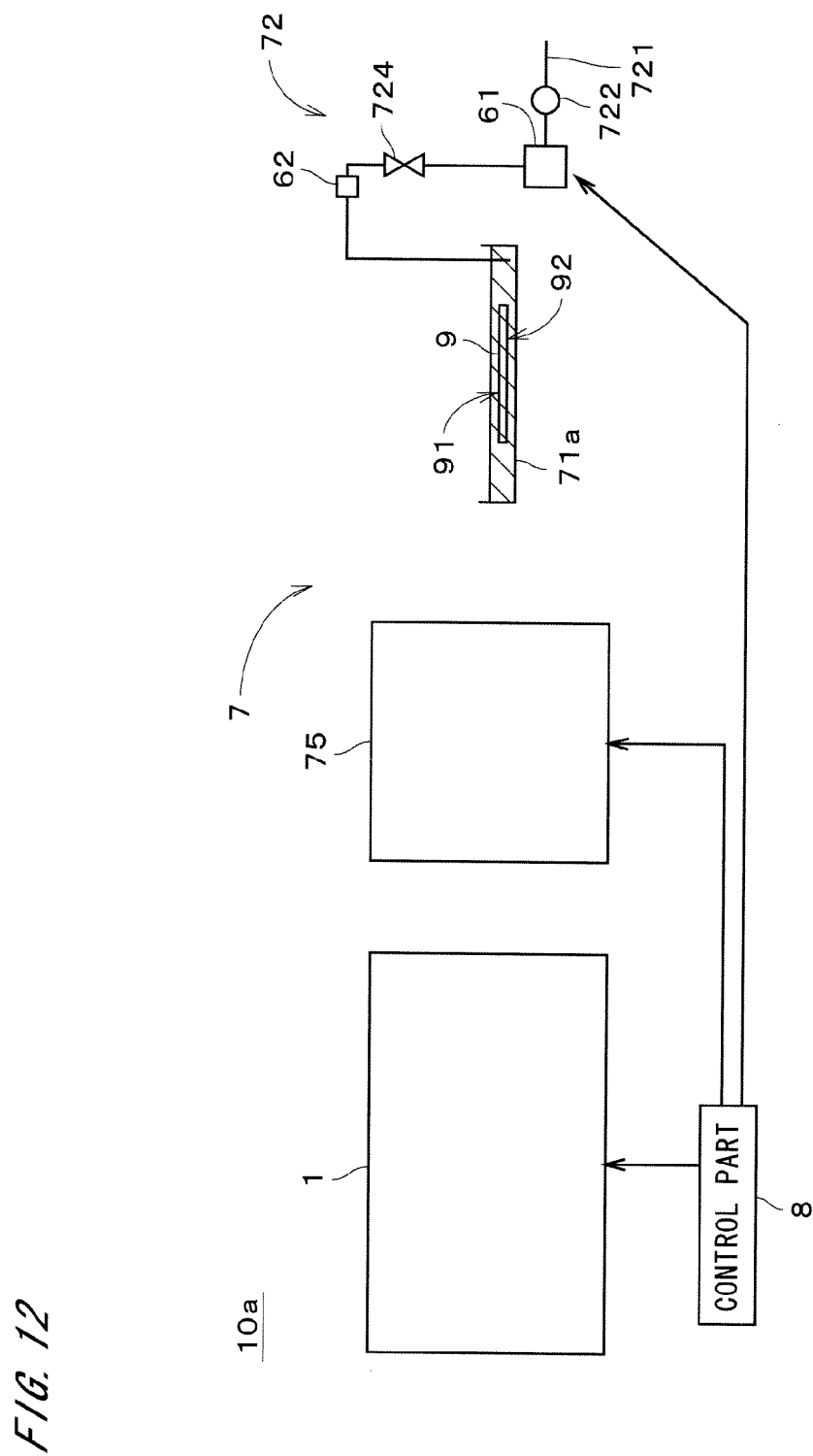
FIG. 12 is a view showing a configuration of a substrate processing apparatus in accordance with a second preferred embodiment of the present invention.

Next, discussion will be made on a substrate processing apparatus 10*a* in accordance with the second preferred embodiment of the present invention. FIG. 12 is a view showing a configuration of the substrate processing apparatus 10*a*. In the substrate processing apparatus 10*a*, the anti-static liquid contacting part 7 includes an anti-static liquid storage part 71*a* which is smaller than the anti-static liquid storage part 71 shown in FIG. 1. In an anti-static liquid stored in the anti-static liquid storage part 71*a*, one substrate 9 is immersed. In the substrate processing apparatus 10*a*, the cartridge 73 or the like shown in FIG. 1 is omitted. The constituent elements other than the above are identical to those in the substrate processing apparatus 10 of FIG. 1 and the corresponding elements are represented by the same reference signs in the following discussion.

An operation flow for processing a substrate in the substrate processing apparatus 10*a* is almost the same as that shown in FIG. 4, except that one substrate 9 is immersed in the anti-static liquid inside the anti-static liquid storage part 71*a* by the control of the control part 8 from a main surface (hereinafter, referred to as a "lower surface 92") of the substrate 9 which is the reverse side of the upper surface 91 in Step S14.

Figure 13:
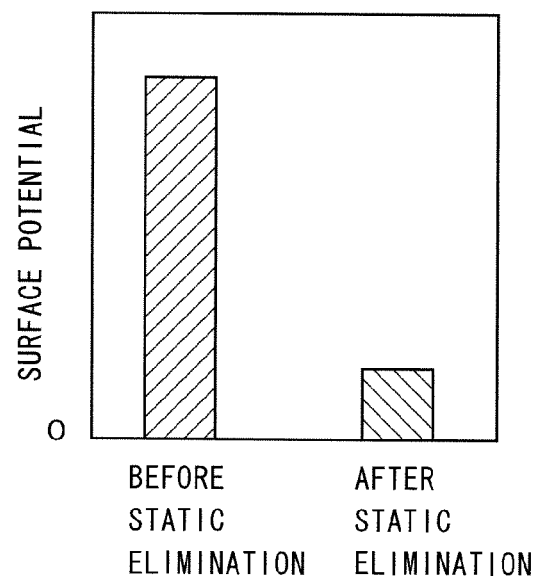
FIG. 13 is a graph showing respective surface potentials of the substrate before and after a static elimination process.

FIG. 13 is a graph showing respective surface potentials on the upper surface 91 of the substrate 9 before and after the static elimination process in the substrate processing apparatus 10*a*. By performing the above-discussed static elimination process, the amount of electric charges on the substrate 9 decreases and the potential of the substrate 9 is reduced on the whole. It is therefore possible to prevent any damage to the device, i.e., any damage to the substrate 9, due to the movement of the electric charges in the SPM process by the single-substrate processing apparatus 1 on the substrate 9 after being subjected to the static elimination process, like in the substrate processing apparatus 10 of FIG. 1. Further, in the anti-static liquid contacting part 7, the anti-static liquid being in contact with the upper surface 91 of the substrate 9 and the anti-static liquid being in contact with the lower surface 92 thereof are continuous with each other on the edge of the substrate 9. It is thereby possible to reduce (the absolute value of the surface potential of the substrate 9 by the static elimination process. Furthermore, in the anti-static liquid contacting part 7, since the whole of the substrate 9 is immersed in the anti-static liquid, it is possible to further reduce (the absolute value of) the surface potential of the substrate 9.

Figure 14:
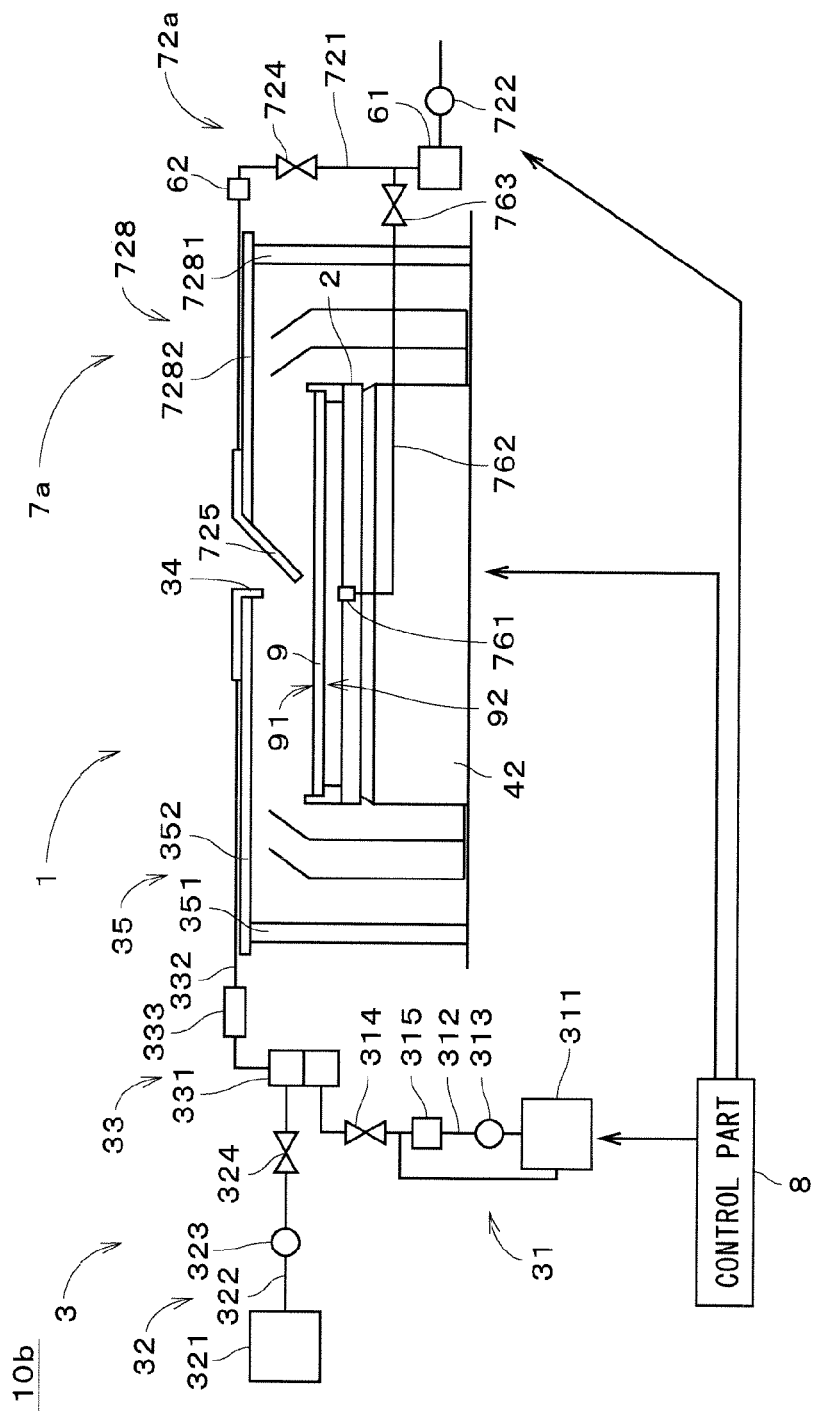
FIG. 14 is a view showing a configuration of a substrate processing apparatus in accordance with a third preferred embodiment of the present invention.

Next, discussion will be made on a substrate processing apparatus 10*b* in accordance with the third preferred embodiment of the present invention. FIG. 14 is a view showing a configuration of the substrate processing apparatus 10*b*. In the substrate processing apparatus 10*b*, an anti-static liquid contacting part 7*a* is provided in the single-substrate processing apparatus 1, instead of the anti-static liquid contacting part 7. In the anti-static liquid contacting part 7*a*, the anti-static liquid storage part, the substrate drying part, and the like are omitted but an anti-static liquid supply part 72*a* having a structure partially different from that of the anti-static liquid supply part 72 shown in FIG. 1 is provided. The constituent elements other than the above are identical to those in the substrate processing apparatus 10 of FIG. 1 and the corresponding elements are represented by the same reference signs in the following discussion.

Like the anti-static liquid supply part 72 shown in FIG. 1, the anti-static liquid supply part 72*a* shown in FIG. 14 includes the anti-static liquid pipe 721, the flowmeter 722, and the anti-static liquid valve 724, and the anti-static liquid pipe 721 is connected to a not-shown anti-static liquid supply source. The anti-static liquid supply part 72*a* further includes an anti-static liquid nozzle 725 provided at the front end of the anti-static liquid pipe 721 and an anti-static liquid nozzle rotating mechanism 728 for horizontally rotating the anti-static liquid nozzle 725 about a rotation axis 7281. The anti-static liquid nozzle rotating mechanism 728 includes an arm 7282 horizontally extending from the rotation axis 7281, to which the anti-static liquid nozzle 725 is attached. On the anti-static liquid pipe 721, from the anti-static liquid supply source toward the anti-static liquid nozzle 725, the flowmeter 722, the temperature adjustment part 61, the anti-static liquid valve 724, and the anti-static liquid measurement part 62 are arranged in this order.

In the single-substrate processing apparatus 1, part of an outer edge of the substrate 9 is supported by the substrate holding part 2 and the lower surface 92 of the substrate 9 and the substrate holding part 2 are spaced from each other except the part of the substrate 9 which is in contact with the substrate holding part 2. The anti-static liquid supply part 72*a* further includes a lower surface liquid-contacting part 761 for supplying the anti-static liquid onto the lower surface 92 of the substrate 9. The lower surface liquid-contacting part 761 is disposed at a position opposed to a center portion of the lower surface 92 of the substrate 9, for discharging the anti-static liquid toward the lower surface 92. The lower surface liquid-contacting part 761 is connected to the anti-static liquid pipe 721 through a lower surface pipe 762, and a lower surface valve 763 is provided on the lower surface pipe 762.

Like the anti-static liquid contacting part 7, in the anti-static liquid contacting part 7*a*, when the temperature adjustment part 61 is controlled by the control part 8 in which the target temperature is set, the temperature of the anti-static liquid is adjusted (FIG. 4: Steps S11 and S12) and maintained at roughly the target temperature. The electrical resistivity of the anti-static liquid is thereby maintained at roughly the target electrical resistivity. Alternatively, the temperature of the anti-static liquid may be roughly maintained within a range not lower than the lower limit temperature and not higher than the upper limit temperature. In the anti-static liquid contacting part 7*a*, there may be another case, as shown in FIGS. 10 and 11, where the target electrical resistivity is set into the control part 8 (Step S31) and the temperature of the anti-static liquid is adjusted on the basis of the target electrical resistivity (Steps S321 to S323, or Steps S324 to S326).

The anti-static liquid after being subjected to the temperature adjustment is transferred to the anti-static liquid nozzle 725 and the lower surface liquid-contacting part 761, and the anti-static liquid is supplied onto the upper surface 91 of the substrate 9 from an outlet at a front end of the anti-static liquid nozzle 725 which is directed toward the center portion of the upper surface 91 of the substrate 9 and the anti-static liquid is also supplied onto the lower surface 92 of the substrate 9 from the lower surface liquid-contacting part 761 opposed to the center portion of the lower surface 92 of the substrate 9. Assuming that the anti-static liquid nozzle 725 and the lower surface liquid-contacting part 761 are referred to as a first anti-static liquid contacting part and a second anti-static liquid contacting part, respectively, in the anti-static liquid contacting part 7*a*, the upper surface 91 and the lower surface 92 of the substrate 9 are brought into contact with the anti-static liquid by the first anti-static liquid contacting part and the second anti-static liquid contacting part, respectively.

Figure 15:
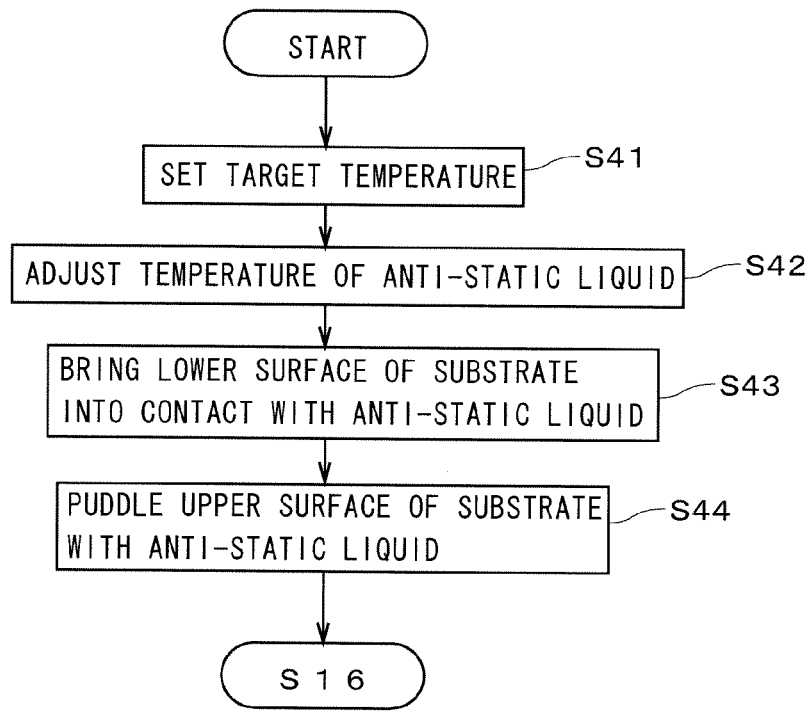
FIG. 15 is a flowchart showing a partial operation flow for processing a substrate.

FIG. 15 is a flowchart showing a partial operation flow for processing the substrate 9 in the substrate processing apparatus 10b. First, like in the substrate processing apparatus 10 of FIG. 1, the target temperature of the anti-static liquid determined on the basis of the size of the device formed on the substrate 9 is set into the control part 8 (Step S41). Subsequently, the electrically charged substrate 9 is loaded into the substrate processing apparatus 10b and held by the substrate holding part 2 of the single-substrate processing apparatus 1.

In the anti-static liquid contacting part 7a, the discharge of the anti-static liquid (deionized water) from the anti-static liquid nozzle 725 is started while the anti-static liquid nozzle 725 is positioned at the waiting position outside the substrate 9. Then, on the basis of the temperature of the anti-static liquid which is the measurement result obtained by the anti-static liquid measurement part 62 and the above-discussed target temperature, the temperature adjustment part 61 is feedback controlled. The temperature of the anti-static liquid is thereby adjusted within the temperature range in which the electrical resistivity of the anti-static liquid is higher than the electrical resistivity of the processing liquid (SPM liquid) (Step S42). The detail of the temperature adjustment of the anti-static liquid is the same as that shown in Steps 121 to S123 of FIG. 5 or Steps S124 to S126 of FIG. 6.

Figure 16:
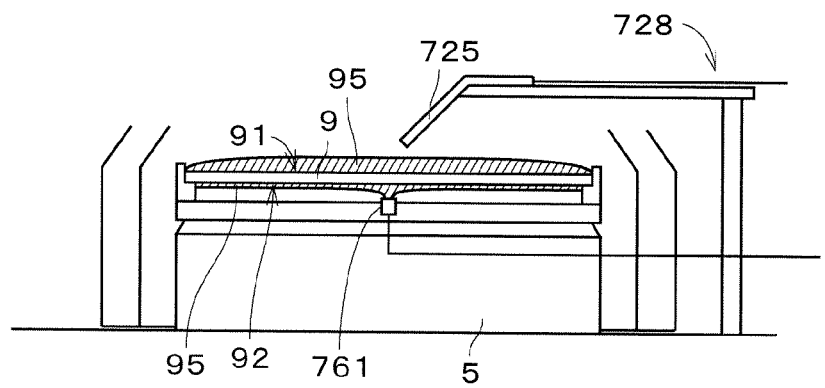
FIG. 16 is a view showing an anti-static liquid on the substrate.

After the temperature adjustment of the anti-static liquid is finished, the substrate rotating mechanism 42 shown in FIG. 14 starts rotation of the substrate 9. Subsequently, as shown in FIG. 16, the lower surface valve 763 is opened, and the discharge of the anti-static liquid 95 after being subjected to the above-discussed temperature adjustment is started from the outlet at the front end of the lower surface liquid-contacting part 761 toward the lower surface 92 of the substrate 9. The rotation speed of the substrate 9 is lower than that in the SPM process discussed later. With the rotation of the substrate 9, the anti-static liquid 95 coming into contact with the lower surface 92 of the substrate 9 spreads from the center portion of the lower surface 92 of the substrate 9 over the entire lower surface 92. After the anti-static liquid 95 spreads over the entire lower surface 92 of the substrate 9, the discharge of the anti-static liquid 95 and the rotation of the substrate 9 are stopped. The state in which the entire lower surface 92 of the substrate 9 (except the contact portion with the substrate holding part 2) is in contact with the anti-static liquid 95 is thereby maintained, and as a result, the electric charges on the lower surface 92 of the substrate 9 are relatively gently moved to the anti-static liquid 95 and the static elimination process is thus performed on the entire lower surface 92 of the substrate 9 (Step S43).

After the supply of the anti-static liquid 95 onto the lower surface 92 of the substrate 9 is finished, the anti-static liquid nozzle rotating mechanism 728 moves the anti-static liquid nozzle 725 from the waiting position and the outlet at the front end of the anti-static liquid nozzle 725 is directed toward the center portion of the upper surface 91 of the substrate 9. Then, after a predetermined amount of anti-static liquid 95 is supplied onto the upper surface 91 of the substrate 9 from the anti-static liquid nozzle 725, the supply of the anti-static liquid 95 from the anti-static liquid nozzle 725 is stopped (a so-called puddle process is performed). The anti-static liquid 95 supplied from the anti-static liquid nozzle 725 spreads from the center portion of the substrate 9 over the entire upper surface 91, and a thin film of the anti-static liquid 95 (having a thickness of e.g., about 1 mm) is thereby formed on the upper surface 91 and the entire upper surface 91 is puddled with the anti-static liquid 95 (Step S44). With this thin film formation, the electric charges on the upper surface 91 of the substrate 9 are relatively gently moved to the anti-static liquid 95 and the static elimination process is thus performed on the entire upper surface 91 of the substrate 9. The anti-static liquid 95 being in contact with the lower surface 92 of the substrate 9 and the anti-static liquid 95 being in contact with the upper surface 91 thereof are not continuous with each other on the substrate 9.

In the substrate processing apparatus 10b, the state in which the entire upper surface 91 of the substrate 9 is puddled with the anti-static liquid 95 and the entire lower surface 92 of the substrate 9 is in contact with the anti-static liquid 95 is maintained for a predetermined time period while the substrate rotating mechanism 42 stops, and the static elimination process is thus performed on the entire upper surface 91 of the substrate 9 and the entire lower surface 92 thereof.

After the static elimination process is finished, the rotation of the substrate 9 starts (FIG. 4: Step S16), and the anti-static liquid on the upper surface 91 and the lower surface 92 of the substrate 9 is removed by the rotation of the substrate 9. It is thereby possible to prevent the anti-static liquid and the SPM liquid from being mixed on the upper surface 91 of the substrate 9 in the next SPM process. As a result, it is possible to prevent the above adverse effects due to the mixture of the anti-static liquid and the processing liquid on the substrate 9.

After the removal of the anti-static liquid is finished, the SPM liquid is supplied onto the upper surface 91 of the substrate 9 from the processing liquid supply part 3 shown in FIG. 14 and the SPM process is performed (Step S17). Subsequently, after the hydrogen peroxide water is supplied onto the upper surface 91 of the substrate 9 from the processing liquid supply part 3 and the hydrogen peroxide water supplying process is thereby performed, the rinse liquid (deionized water) is supplied onto the upper surface 91 of the substrate 9 and the rinse process is thereby performed (Steps S18 and S19). The rinse liquid may be supplied from a not-shown rinse liquid supply part or from the anti-static liquid nozzle 725 of the anti-static liquid contacting part 7a. After that, the drying process for removing the rinse liquid from the substrate 9 with the rotation of the substrate 9 is performed, and then the rotation of the substrate 9 is stopped (Steps S20 and S21).

Figure 17:
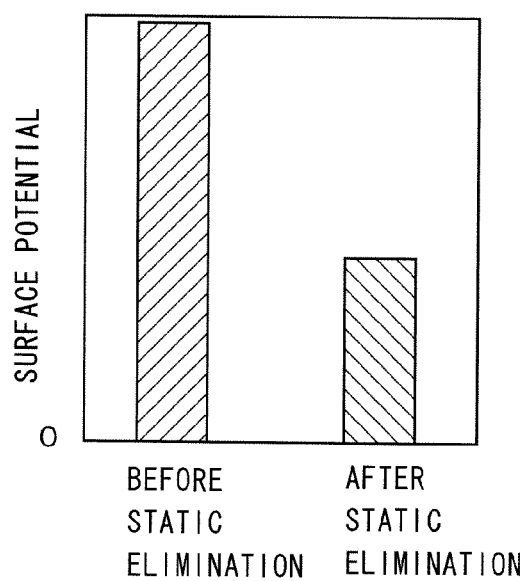
FIG. 17 is a graph showing respective surface potentials of the substrate before and after a static elimination process.

FIG. 17 is a graph showing respective surface potentials of the upper surface 91 of the substrate 9 before and after the static elimination process in the substrate processing apparatus 10b. By performing the above-discussed static elimination process, the amount of electric charges on the substrate 9 decreases and the potential of the substrate 9 is reduced on the whole. It is therefore possible to prevent any damage to the device, i.e., any damage to the substrate 9, due to the movement of the electric charges in the SPM process on the substrate 9 after being subjected to the static elimination process, like in the substrate processing apparatus 10 of FIG. 1. Further, in the substrate processing apparatus 10b, by providing the anti-static liquid contacting part 7a in the single-substrate processing apparatus 1, the size of the substrate processing apparatus 10b can be reduced.

In the substrate processing apparatus 10b, the static elimination process is performed on the substrate 9 while the substrate rotating mechanism 42 substantially stops. It is thereby possible to perform the static elimination of the substrate 9 with high efficiency. The state in which the substrate rotating mechanism 42 substantially stops includes not only the state in which the rotation of the substrate 9 by the substrate rotating mechanism 42 is completely stopped as discussed above but also a state in which the substrate rotating mechanism 42 rotates the substrate 9 at a very small number of rotations (e.g., 10 to 200 rpm) and substantially no effect is produced on the layer of the anti-static liquid on the substrate 9 by that rotation.

Figure 18:
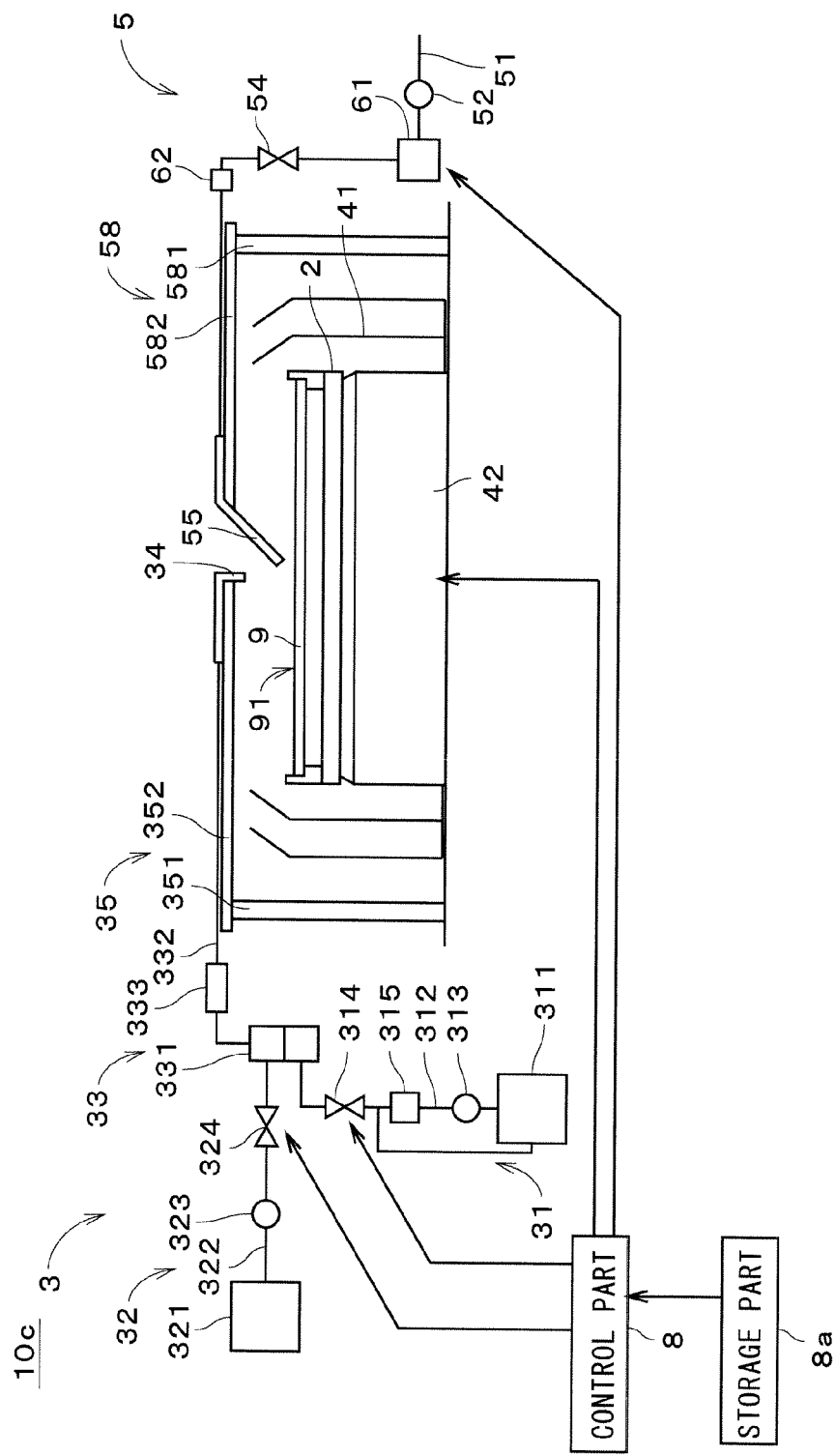
FIG. 18 is a view showing a configuration of a substrate processing apparatus in accordance with a fourth preferred embodiment of the present invention.

FIG. 18 is a view showing a configuration of a substrate processing apparatus 10c in accordance with the fourth preferred embodiment of the present invention. As shown in FIG. 18, the substrate processing apparatus 10c is a single-substrate processing apparatus for processing semiconductor substrates 9 (hereinafter, referred to simply as "substrates 9") one by one. In the substrate processing apparatus 10c, the SPM liquid is supplied onto the substrate 9, to thereby perform then SPM process, i.e., a process of removing a resist film from the substrate 9.

The substrate processing apparatus 10c includes the substrate holding part 2, the processing liquid supply part 3, the cup part 41, the substrate rotating mechanism 42, an anti-static liquid supply part 5, the temperature adjustment part 61, the anti-static liquid measurement part 62, and the control part 8. The substrate holding part 2 holds a substrate 9 with one main surface 91 (hereinafter, referred to as an "upper surface 91") thereof directed upward. The processing liquid supply part 3 supplies a processing liquid such as the SPM liquid or the like onto the upper surface 91 of the substrate 9. The cup part 41 surrounds the periphery of the substrate 9 and the substrate holding part 2.

The substrate rotating mechanism 42 horizontally rotates the substrate 9 together with the substrate holding part 2. The substrate 9 is rotated by the substrate rotating mechanism 42 about a rotation axis which goes through a center of the substrate 9 and is perpendicular to the upper surface 91 of the substrate 9. The anti-static liquid supply part 5 supplies the anti-static liquid onto the upper surface 91 of the substrate 9. The temperature adjustment part 61 adjusts the temperature of the anti-static liquid to be supplied onto the substrate 9. The anti-static liquid measurement part 62 is a temperature sensor for measuring the temperature of the anti-static liquid. The storage part 8a holds the target temperature and the static elimination time (discussed later in detail) and sets these temperature and time into the control part 8 when a substrate processing is performed. The control part 8 controls the processing liquid supply part 3, the anti-static liquid supply part 5, the temperature adjustment part 61, the anti-static liquid measurement part 62, and the like on the basis of the above target temperature and the like. In the substrate processing apparatus 10c, the substrate holding part 2, the cup part 41, the substrate rotating mechanism 42, and the like are accommodated in a not-shown chamber.

The processing liquid supply part 3 includes the sulfuric acid supply part 31 for supplying sulfuric acid, the hydrogen peroxide water supply part 32 for supplying hydrogen peroxide water, the mixture generation part 33 connected to the sulfuric acid supply part 31 and the hydrogen peroxide water supply part 32, the processing liquid nozzle 34 disposed above the substrate 9, for discharging a liquid toward the substrate 9, and the processing liquid nozzle rotating mechanism 35 for horizontally rotating the processing liquid nozzle 34 about the rotation axis 351. The processing liquid nozzle rotating mechanism 35 includes the arm 352 horizontally extending from the rotation axis 351, to which the processing liquid nozzle 34 is attached.

The sulfuric acid supply part 31 includes the sulfuric acid storage part 311 for storing sulfuric acid therein, the sulfuric acid pipe 312 connected to the sulfuric acid storage part 311 and the mixture generation part 33, the sulfuric acid pump 313 for supplying the sulfuric acid from the sulfuric acid storage part 311 to the mixture generation part 33 through the sulfuric acid pipe 312, the sulfuric acid valve 314 provided on the sulfuric acid pipe 312, and the sulfuric acid heating part 315 provided on the sulfuric acid pipe 312 between the sulfuric acid pump 313 and the sulfuric acid valve 314, for heating the sulfuric acid. The sulfuric acid pipe 312 branches between the sulfuric acid heating part 315 and the sulfuric acid valve 314, being connected to the sulfuric acid storage part 311, and when the sulfuric acid valve 314 is closed, the sulfuric acid heated by the sulfuric acid heating part 315 circulates between the sulfuric acid storage part 311 and the sulfuric acid heating part 315.

The hydrogen peroxide water supply part 32 includes the hydrogen peroxide water storage part 321 for storing hydrogen peroxide water therein, the hydrogen peroxide water pipe 322 connected to the hydrogen peroxide water storage part 321 and the mixture generation part 33, the hydrogen peroxide water pump 323 for supplying the hydrogen peroxide water from the hydrogen peroxide water storage part 321 to the mixture generation part 33 through the hydrogen peroxide water pipe 322, and the hydrogen peroxide water valve 324 provided on the hydrogen peroxide water pipe 322. The sulfuric acid storage part 311 and the hydrogen peroxide water storage part 321 may be provided outside the substrate processing apparatus 10c, being connected to the sulfuric acid pipe 312 and the hydrogen peroxide water pipe 322, respectively.

The mixture generation part 33 includes the mixing valve 331 to which the sulfuric acid pipe 312 and the hydrogen peroxide water pipe 322 are connected, the discharging pipe 332 connected to the mixing valve 331 and the processing liquid nozzle 34, and the agitator flow tube 333 provided on the discharging pipe 332. In the mixture generation part 33, the heated sulfuric acid supplied from the sulfuric acid supply part 31 and the hydrogen peroxide water of ordinary temperature (almost the same temperature as the room temperature) supplied from the hydrogen peroxide water supply part 32 are mixed in the mixing valve 331, to thereby generate the SPM liquid (sulfuric acid/hydrogen peroxide/water mixture) which is a mixed solution.

The SPM liquid goes through the agitator flow tube 333 and the discharging pipe 332 and is transferred to the processing liquid nozzle 34. In the agitator flow tube 333, the SPM liquid is agitated to accelerate the chemical reaction of the sulfuric acid contained in the SPM liquid and the hydrogen peroxide water. The SPM liquid serving as a processing liquid is discharged from the outlet at the front end of the processing liquid nozzle 34 toward the upper surface 91 of the substrate 9. In the fourth preferred embodiment, the sulfuric acid heated to about 130 to 150 degrees Celsius by the sulfuric acid heating part 315 is supplied from the sulfuric acid supply part 31 to the mixture generation part 33. The temperature of the sulfuric acid to be supplied from the sulfuric acid supply part 31 may be changed as appropriate.

The anti-static liquid supply part 5 includes an anti-static liquid pipe 51, a flowmeter 52, an anti-static liquid valve 54, an anti-static liquid nozzle 55, and an anti-static liquid nozzle rotating mechanism 58. The anti-static liquid pipe 51 is connected to the anti-static liquid nozzle 55 and a not-shown anti-static liquid supply source. An outlet at a front end of the anti-static liquid nozzle 55 is positioned above the center portion of the upper surface 91 of the substrate 9. The anti-static liquid from the anti-static liquid supply source is guided by the anti-static liquid pipe 51 to the anti-static liquid nozzle 55 and discharged from the outlet of the anti-static liquid nozzle 55 onto the upper surface 91 of the substrate 9. The anti-static liquid nozzle rotating mechanism 58 includes an arm 582 horizontally extending from the rotation axis 581, to which the anti-static liquid nozzle 55 is attached. The anti-static liquid nozzle rotating mechanism 58 horizontally rotates the anti-static liquid nozzle 55 together with the arm 582 about a rotation axis 581.

On the anti-static liquid pipe 51, from the anti-static liquid supply source toward the anti-static liquid nozzle 55, the flowmeter 52, the temperature adjustment part 61, the anti-static liquid valve 54, and the anti-static liquid measurement part 62 are arranged in this order. The flowmeter 52 measures the amount of flow of anti-static liquid flowing in the anti-static liquid pipe 51. The temperature adjustment part 61 heats or cools the anti-static liquid flowing in the anti-static liquid pipe 51 as necessary, to thereby adjust the temperature of the anti-static liquid in the anti-static liquid pipe 51. The anti-static liquid valve 54 adjusts the amount of flow of anti-static liquid flowing in the anti-static liquid pipe 51. The anti-static liquid measurement part 62 measures the temperature of the anti-static liquid flowing in the anti-static liquid pipe 51. In the anti-static liquid supply part 5, deionized water is used as the anti-static liquid.

A relation between the temperature of deionized water and the electrical resistivity thereof is as shown in FIG. 3. As shown in FIG. 3, the electrical resistivity of deionized water gradually decreases as a liquid temperature increases. The electrical resistivity of deionized water is higher than the electrical resistivity of the SPM liquid in all range not lower than the freezing point of deionized water and not higher than the boiling point thereof. The anti-static liquid supplied from the anti-static liquid supply part 5 is not limited to deionized water but various kinds of liquid may be used as the anti-static liquid only if the electrical resistivity of the liquid gradually decreases as the liquid temperature increases. Further, the electrical resistivity of the anti-static liquid has only to be higher than the electrical resistivity of the processing liquid supplied from the processing liquid supply part 3 at least in a predetermined temperature range not lower than the freezing point of the anti-static liquid and not higher than the boiling point thereof. As the anti-static liquid, for example, an ionic liquid such as carbon dioxide water ($CO_2$ water) in which carbon dioxide ($CO_2$) is dissolved in deionized water may be used. The same applies to other preferred embodiments.

A measurement result (i.e., the temperature of the anti-static liquid) obtained by the anti-static liquid measurement part 62 is transferred to the control part 8. The control part 8 controls the single-substrate processing apparatus 1, the temperature adjustment part 61, the anti-static liquid measurement part 62, and the like on the basis of the target temperature of the anti-static liquid stored in the storage part 8a, in other words, a desired temperature of the anti-static liquid used in the static elimination process discussed later. The target temperature of the anti-static liquid refers to a temperature required to achieve desired electrical resistivity (i.e., target electrical resistivity) of the anti-static liquid used in the static elimination process. The target electrical resistivity of the anti-static liquid is higher than the electrical resistivity of the processing liquid supplied from the processing liquid supply part 3. The target temperature is obtained on the basis of the target electrical resistivity, the relation between the temperature of the anti-static liquid and the electrical resistivity thereof shown in FIG. 3, and the like. A specific method of obtaining the target temperature will be discussed later.

The target electrical resistivity is set higher as the size of a device which is formed on the upper surface 91 of the substrate 9 in advance is smaller (in other words, as the minimum width of a wiring line on the device is smaller). Therefore, the target temperature is set lower as the size of the device which is formed on the upper surface 91 of the substrate 9 in advance is smaller. In the fourth preferred embodiment, the target electrical resistivity is set in a range from about 1 to 18 MO·cm (megaohm-cm), and the target temperature is set in a range from about 25 to 100 degrees Celsius.

In the substrate processing apparatus 10c, the temperature adjustment part 61 is feedback controlled by the control part 8 on the basis of the measurement result obtained by the anti-static liquid measurement part 62 and the above-discussed target temperature. In the temperature adjustment part 61, the temperature of the anti-static liquid is adjusted so that a difference between the temperature of the anti-static liquid in the anti-static liquid pipe 51 and the target temperature may become smaller. The temperature of the anti-static liquid to be supplied onto the upper surface 91 of the substrate 9 is maintained at roughly the target temperature. In other words, by the above-discussed feedback control, the temperature of the anti-static liquid is maintained within a narrow temperature range which is substantially equal to the target temperature (naturally, the temperature range includes the target temperature).

In the substrate processing apparatus 10c, there is a case where a temperature of the anti-static liquid which differs a little from the target temperature is acceptable. In such a case, when a difference between the temperature of the anti-static liquid which is obtained by the measurement of the anti-static liquid measurement part 62 and the target temperature is not larger than the threshold temperature difference, adjustment of the temperature of the anti-static liquid by the temperature adjustment part 61 is stopped by the control part 8, and only when the difference between the temperature of the anti-static liquid and the target temperature is larger than the threshold temperature difference, the adjustment of the temperature of the anti-static liquid by the temperature adjustment part 61 is performed. Assuming that the temperature which is lower than the target temperature by the threshold temperature difference is referred to as a "lower limit temperature" and the temperature which is higher than the target temperature by the threshold temperature difference is referred to as an "upper limit temperature", by the above-discussed temperature adjustment, the temperature of the anti-static liquid to be supplied onto the substrate 9 is roughly maintained within a range not lower than the lower limit temperature and not higher than the upper limit temperature. The electrical resistivity of the anti-static liquid at the upper limit temperature is higher than the electrical resistivity of the processing liquid supplied from the processing liquid supply part 3.

Thus, in the anti-static liquid supply part 5, the control part 8 controls the temperature adjustment part 61 to adjust the temperature of the anti-static liquid to be supplied onto the substrate 9 within a range in which the electrical resistivity of the anti-static liquid is higher than the electrical resistivity of the above-discussed processing liquid.

Next, with reference to FIG. 19, discussion will be made on an operation flow for processing the substrate 9 in the substrate processing apparatus 10c. First, the target temperature and the static elimination time corresponding to the substrate 9 to be used are read out from the storage part 8a and set into the control part 8 (Step S71). In the fourth preferred embodiment, the target temperature and the static elimination time are stored in the storage part 8a in advance, and read out from the storage part 8a and set into the control part 8 at the time when the substrate processing is started. There may be another case, however, where the target temperature and the static elimination time are not stored in the storage part 8a and an operator sets these temperature and time into the control part 8 by using a not-shown input part every time when the substrate processing is started.

Further, instead of storing the target temperature into the storage part 8a, a table indicating a relation between the size of the device on the substrate 9 and the target temperature of the anti-static liquid may be stored into the storage part 8a in advance. In such a case, before the processing of the substrate 9 is started, a size of the device on the substrate 9 to be processed is inputted to the storage part 8a, the target temperature corresponding to the substrate 9 is next determined on the basis of the size of the device and the above table, and finally the target temperature is set into the control part 8. As for determination of the target temperature and the static elimination time and setting of these temperature and time into the control part 8 (alternatively, as for determination of the target electrical resistivity and setting of the same discussed later), the same applies to other substrate processing apparatuses discussed later.

Subsequently, the substrate 9 is loaded into the substrate processing apparatus 10c and held by the substrate holding part 2. Before being loaded into the substrate processing apparatus 10c, the substrate 9 is subjected to a drying process such as dry etching, plasma CVD (Chemical Vapor Deposition), or the like, and the substrate 9 is thereby electrically charged.

In the anti-static liquid supply part 5, while the anti-static liquid nozzle 55 is positioned at the waiting position outside the substrate 9, the control part 8 opens the anti-static liquid valve 54 and the anti-static liquid nozzle 55 starts discharge of the anti-static liquid (deionized water). Then, the temperature adjustment part 61 is feedback controlled on the basis of the measurement result obtained by the anti-static liquid measurement part 62, i.e., the temperature of the anti-static liquid, and the above-discussed target temperature. The temperature of the anti-static liquid is thereby adjusted to be within a temperature range in which the electrical resistivity of the anti-static liquid is higher than the electrical resistivity of the processing liquid (SPM liquid) (Step S72). The operation flow of the temperature adjustment of the anti-static liquid in Step S72 is the same as that shown in Steps S121 to S123 of FIG. 5 or Steps 124 to S126 of FIG. 6.

After the temperature adjustment of the anti-static liquid is finished, the anti-static liquid nozzle 55 is moved from the waiting position by the anti-static liquid nozzle rotating mechanism 58, and as shown in FIG. 18, the outlet at the front end of the anti-static liquid nozzle 55 is directed toward the center portion of the upper surface 91 of the substrate 9. At that time, the substrate rotating mechanism 42 stops and the substrate 9 is not rotated.

After a predetermined amount of anti-static liquid is supplied onto the upper surface 91 of the substrate 9 from the anti-static liquid nozzle 55, the supply of the anti-static liquid from the anti-static liquid nozzle 55 is stopped (a so-called puddle process is performed). The anti-static liquid supplied from the anti-static liquid nozzle 55 spreads from the center portion of the substrate 9 over the entire upper surface 91, and a thin film of the anti-static liquid (having a thickness of e.g., about 1 mm) is thereby formed on the upper surface 91 and the entire upper surface 91 is puddled with the anti-static liquid.

Thus, by bringing the upper surface 91 of the substrate 9 into contact with the anti-static liquid, the electric charges on the substrate 9 are relatively gently moved to the anti-static liquid. Then, the state (wetted state) in which the substrate 9 is in contact with the anti-static liquid is maintained for a predetermined time period, and the amount of electric charges on the substrate 9 thereby decreases without giving any damage to the device formed on the substrate 9. In other words, a puddle process for the upper surface 91 of the substrate 9 with the anti-static liquid is performed, and the static elimination process for the entire upper surface 91 of the substrate 9 is thereby performed (Step S73). The puddle process is performed while the substrate rotating mechanism 42 stops.

Figure 20:
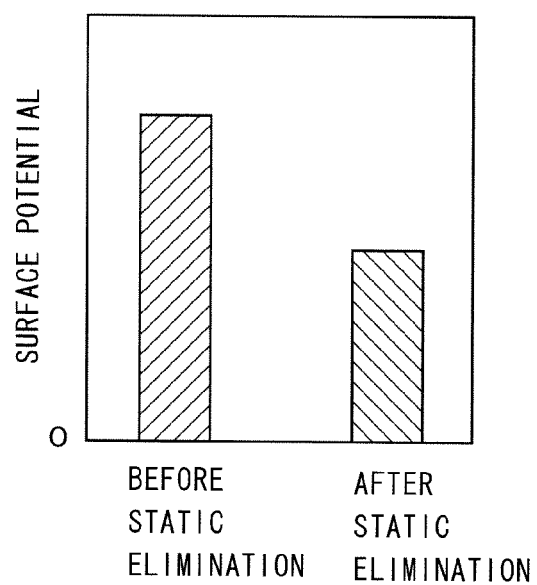
FIG. 20 is a graph showing respective surface potentials of the substrate before and after a static elimination process.

FIG. 20 is a graph showing respective surface potentials on the upper surface 91 of the substrate 9 before and after the static elimination process in the substrate processing apparatus 10c. FIG. 20 shows respective absolute values of the surface potentials at the center portion of the substrate 9. By performing the above-discussed static elimination process, the amount of electric charges on the substrate 9 decreases and the potential of the substrate 9 is reduced on the whole. In the substrate processing apparatus 10c, when the size of the device formed on the substrate 9 is relatively small, the temperature of the anti-static liquid is maintained, for example, at about 25 degrees Celsius and the electrical resistivity of the anti-static liquid is about 18 MO·cm. Further, when the size of the device formed on the substrate 9 is relatively large (in other words, the resistance to the damage due to the movement of the electric charges is relatively high), the temperature of the anti-static liquid is maintained, for example, at a temperature slightly lower than 100 degrees Celsius and the electrical resistivity of the anti-static liquid is about 1 MO·cm. Thus, by making the temperature of the anti-static liquid higher and making the electrical resistivity thereof relatively lower, the movement speed of the electric charges from the substrate 9 to the anti-static liquid increases. As a result, it is possible to reduce the time required to perform the static elimination process on the substrate 9.

After the static elimination process on the substrate 9 is finished, the anti-static liquid nozzle rotating mechanism 58 moves the anti-static liquid nozzle 55 back to the waiting position. Subsequently, the control part 8 controls the substrate rotating mechanism 42 to start rotation of the substrate 9 (Step S74). Then, with the rotation of the substrate 9, the anti-static liquid on the upper surface 91 of the substrate 9 is moved toward the edge of the substrate 9 and scattered out of the edge of the substrate 9, to be thereby removed from the entire upper surface 91 of the substrate 9 (Step S75). The anti-static liquid scattered out of the substrate 9 is received by the cup part 41. In the substrate processing apparatus 10c, the substrate rotating mechanism 42 serves as a liquid removing part for removing the liquid from the upper surface 91 by rotating the substrate 9.

After the removal of the anti-static liquid is finished, the number of rotations of the substrate 9 by the substrate rotating mechanism 42 decreases to the number of rotations in the SPM process. Further, the processing liquid nozzle rotating mechanism 35 starts rotation of the processing liquid nozzle 34 and the processing liquid nozzle 34 thereby repeats reciprocating motion between the center portion of the substrate 9 and the edge thereof.

Next, the control part 8 controls the processing liquid supply part 3 to open the sulfuric acid valve 314 of the sulfuric acid supply part 31, and the sulfuric acid heated by the sulfuric acid heating part 315 up to about 130 to 150 degrees Celsius is thereby supplied to the mixing valve 331 of the mixture generation part 33 through the sulfuric acid pipe 312. Further, the control part 8 opens the hydrogen peroxide water valve 324 and the hydrogen peroxide water of room temperature is thereby supplied from the hydrogen peroxide water storage part 321 to the mixing valve 331 through the hydrogen peroxide water pipe 322. In the mixing valve 331, the heated sulfuric acid and the hydrogen peroxide water of room temperature are mixed to generate the SPM liquid. The temperature of the SPM liquid is increased to, e.g., about 150 to 195 degrees Celsius which is higher than the temperature of the sulfuric acid supplied from the sulfuric acid supply part 31, by the reaction of the sulfuric acid and the hydrogen peroxide water.

The SPM liquid goes through the discharging pipe 332 and the agitator flow tube 333 and is supplied from the processing liquid nozzle 34 onto the upper surface 91 of the substrate 9. In other words, the processing liquid supply part 3 supplies the heated sulfuric acid and the hydrogen peroxide water while being mixed, onto the upper surface 91 of the substrate 9. With the rotation of the substrate 9, the SPM liquid spreads over the entire upper surface 91 of the substrate 9 and is scattered out of the edge of the substrate 9, and then received by the cup part 41. In the substrate processing apparatus 10*c*, the SPM liquid is continuously supplied onto the substrate 9 for a predetermined time period, and the SPM process for the substrate 9, i.e., a process of removing the resist film on the substrate 9 with a strong oxidizing power of Caro's acid contained in the SPM liquid is performed (Step S76). Further, in the substrate processing apparatus 10*c*, the SPM liquid or the like may be supplied from the processing liquid nozzle 34 which stays still above the center portion of the substrate 9.

After the SPM process is finished, the sulfuric acid valve 314 is closed while the hydrogen peroxide water valve 324 remains open, and the hydrogen peroxide water goes through the mixing valve 331, the discharging pipe 332, and the agitator flow tube 333 and is supplied from the processing liquid nozzle 34 onto the substrate 9 from which the resist film is removed (Step S77). By performing the hydrogen peroxide water supplying process, the SPM liquid which remains in the mixing valve 331, the discharging pipe 332, the agitator flow tube 333, and the processing liquid nozzle 34 is removed. With the rotation of the substrate 9, the hydrogen peroxide water supplied onto the substrate 9 spreads over the entire upper surface 91 of the substrate 9 and the SPM liquid remaining on the substrate 9 is thereby pushed out of the edge of the substrate 9 and removed therefrom.

After the hydrogen peroxide water supplying process is finished, the hydrogen peroxide water valve 324 is closed to stop the supply of the hydrogen peroxide water, and the processing liquid nozzle rotating mechanism 35 moves the processing liquid nozzle 34 to the waiting position outside the substrate 9. Next, the rinse process is performed, in which the rinse liquid is supplied from a not-shown rinse liquid supply part onto the upper surface 91 of the substrate 9 (Step S78). As the rinse liquid, for example, deionized water or the carbon dioxide water ($CO_2$ water) is used. With the rotation of the substrate 9, the rinse liquid spreads over the entire upper surface 91 of the substrate 9. The hydrogen peroxide water remaining on the substrate 9 is thereby rinsed out. After the rinse process is continuously performed for a predetermined time period, the supply of the rinse liquid is stopped. Then, the number of rotations of the substrate 9 is increased, and the drying process for removing the rinse liquid remaining on the substrate 9 by the rotation of the substrate 9 is performed (Step S79). After that, the rotation of the substrate 9 is stopped (Step S80), and the substrate 9 is unloaded from the substrate processing apparatus 10*c*.

As discussed above, in the substrate processing apparatus 10*c*, before the processing using the processing liquid supplied from the processing liquid supply part 3 (i.e., the SPM process using the SPM liquid) is performed, the anti-static liquid having electrical resistivity higher than that of the processing liquid is supplied onto the substrate 9 which is electrically charged by the preprocessing such as dry etching, plasma CVD, or the like and the entire upper surface 91 of the substrate 9 is puddled with the anti-static liquid. From the entire upper surface 91 of the substrate 9, static electricity is thereby relatively gently removed. Since there arises no heat generation due to rapid movement of the electric charges from the substrate 9 to the anti-static liquid in the static elimination, it is possible to prevent any damage to the device formed on the substrate 9.

Then, since the above processing liquid (SPM liquid) is supplied onto the substrate 9 from which static electricity is removed, there arises no rapid movement of a large amount of electric charges from the substrate 9 to the processing liquid even when the substrate 9 is brought into contact with the processing liquid having electrical resistivity lower than that of the anti-static liquid. It is therefore possible to prevent any damage to the device, i.e., any damage to the substrate 9, due to the movement of the electric charges also in the processing using the processing liquid.

In the substrate processing apparatus 10*c*, by adjusting the temperature of the anti-static liquid by the temperature adjustment part 61, the entire upper surface 91 of the substrate 9 is puddled with the anti-static liquid while the electrical resistivity of the anti-static liquid is maintained higher than that of the processing liquid. It is thereby possible to perform the static elimination process on the substrate 9 without giving any damage to the device, as discussed above. Further, since the temperature of the anti-static liquid is made higher and the electrical resistivity thereof is made lower within the range in which no damage is given to the device, it is possible to increase the movement speed of the electric charges from the substrate 9 to the anti-static liquid. As a result, it is possible to reduce the time required to perform the static elimination process on the substrate 9.

The electrical resistivity of the anti-static liquid may be also adjusted by using, for example, an ionic liquid in which carbon dioxide ($CO_2$) or the like is dissolved in deionized water as the anti-static liquid and controlling the ion concentration of the anti-static liquid. There is a possibility, however, that this method may increase the cost required for the static elimination process since carbon dioxide or the like is used. Further, the electrical resistivity of this anti-static liquid cannot be made higher, as compared with the electrical resistivity of deionized water at the same temperature. In contrast to this, in the above-discussed substrate processing apparatus 10*c*, since the electrical resistivity of the anti-static liquid is adjusted by controlling the temperature of the anti-static liquid, it is possible to easily adjust the electrical resistivity of the anti-static liquid at low cost.

As discussed above, in the substrate processing apparatus 10*c*, lower temperature is determined as the target temperature of the anti-static liquid and higher electrical resistivity is determined as the target electrical resistivity thereof as the size of the device formed on the substrate 9 is smaller. It is thereby possible to both prevent any damage to the substrate 9 in the processing using the processing liquid and reduce the time required for the static elimination process appropriately in accordance with the size of the device.

In the substrate processing apparatus 10c, the static elimination process is performed on the substrate 9 while the substrate rotating mechanism 42 substantially stops. It is thereby possible to perform the static elimination of the substrate 9 with high efficiency. The state in which the substrate rotating mechanism 42 substantially stops includes not only the state in which the rotation of the substrate 9 by the substrate rotating mechanism 42 is completely stopped as discussed above but also a state in which the substrate rotating mechanism 42 rotates the substrate 9 at a very small number of rotations (e.g., 10 to 200 rpm) and substantially no effect is produced on the layer of the anti-static liquid on the substrate 9 by that rotation. When the static elimination process is performed while the substrate 9 is rotated at a very small number of rotations, the rotation of the substrate 9 is started before Step S73.

In the substrate processing apparatus 10c, between the puddle process on the entire upper surface 91 of the substrate 9 with the anti-static liquid (Step S73: the static elimination process) and the processing (Step S76: the SPM process) using the processing liquid, the anti-static liquid is removed from the upper surface 91 of the substrate 9 by controlling the substrate rotating mechanism 42 to serve as the liquid removing part by the control part 8 (Step S75). It is thereby possible to prevent any adverse effects due to the mixture of the anti-static liquid and the processing liquid on the substrate 9. As the adverse effects, there are, for example, damage (so-called heat shock) to the substrate 9 due to the heat of reaction between deionized water serving as the anti-static liquid and the sulfuric acid contained in the SPM liquid, deterioration in the quality of the SPM process due to the dilution of the SPM liquid with the anti-static liquid, and deterioration in the uniformity of the SPM process over the entire substrate 9 due to the ununiformity in the concentration of the SPM liquid which is caused by the partial mixture of the SPM liquid and the anti-static liquid.

In the substrate processing apparatus 10c, with the rotation of the substrate 9 by the substrate rotating mechanism 42, it is possible to easily remove the anti-static liquid from the substrate 9. Further, since the anti-static liquid can be removed from the substrate 9 by the substrate rotating mechanism 42 used for rotating the substrate 9 in the SPM process, it is possible to simplify the constitution of the substrate processing apparatus 10c.

In the substrate processing apparatus 10c, by performing the temperature adjustment shown in the above Steps S121 to S123, the temperature of the anti-static liquid can be adjusted with high accuracy. Further, in the case where the temperature adjustment shown in Steps S124 to S126 is performed, it is possible to simplify the control of the temperature adjustment part 61 by the control part 8 as compared with the case where the temperature adjustment shown in Steps S121 to S123 is performed.

As discussed above, in the substrate processing apparatus 10c, deionized water is used as the anti-static liquid. It is thereby possible to reduce the cost required to use the anti-static liquid as compared with the case where the ionic liquid in which carbon dioxide ($CO_2$) or the like is dissolved in deionized water is used as the anti-static liquid.

Figure 19:
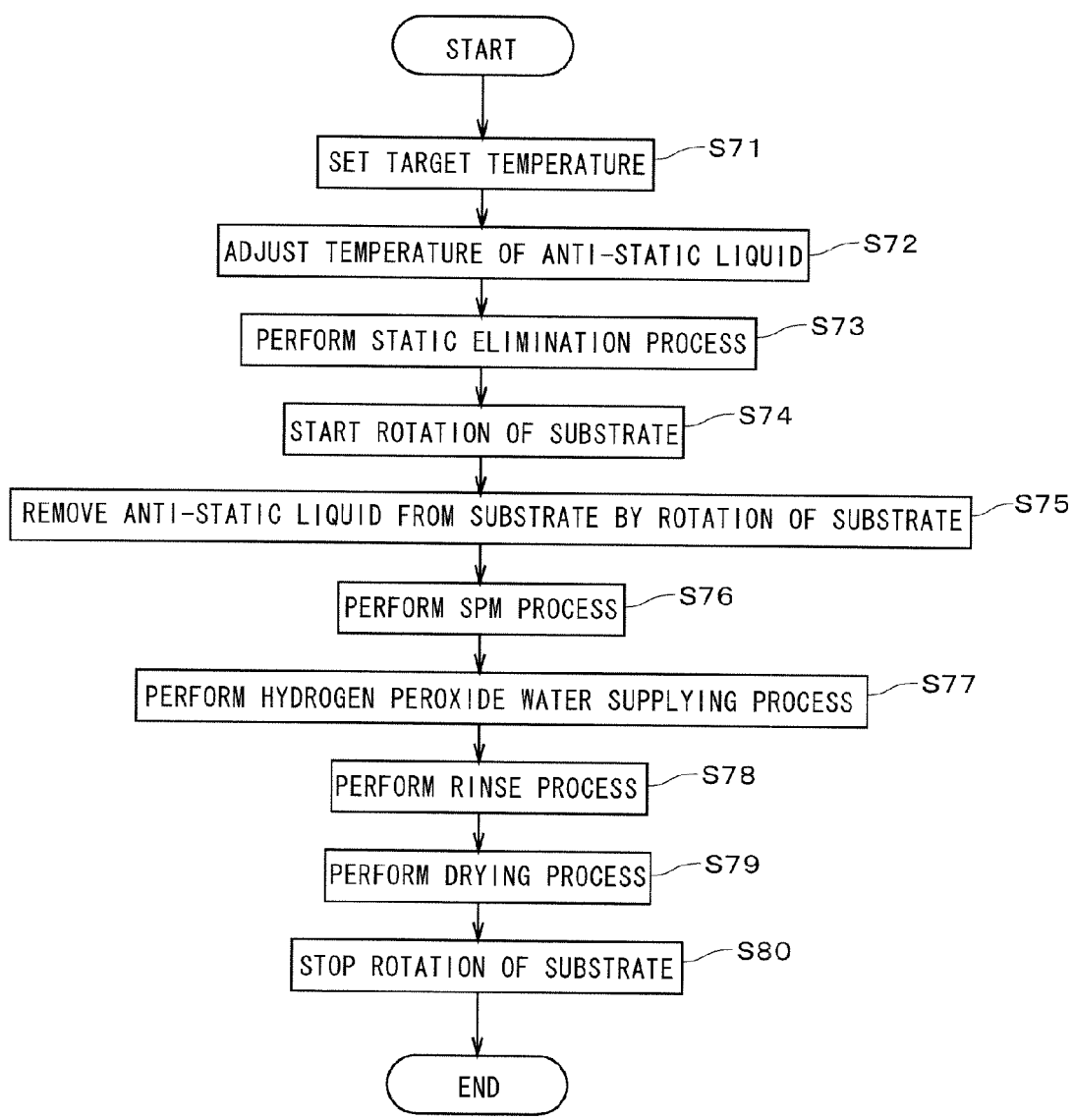
FIG. 19 is a flowchart showing an operation flow for processing a substrate.

Since an operation flow for determining the target temperature to be set into the control part 8 in Step S71 of FIG. 19 is similar to the operation flow shown in FIGS. 8A and 8B, hereinafter, discussion will be made on determination of the target temperature with reference to FIGS. 8A and 8B. In a process for determining the target temperature, first, the electrical resistivity of the processing liquid (SPM liquid) to be used in Step S76 is measured and obtained (Step S611). Subsequently, the relation between the temperature of the anti-static liquid (deionized water) and the electrical resistivity thereof shown in FIG. 3 is obtained (Step S612). Then, on the basis of the relation obtained in Step S612, acquired is the temperature of the anti-static liquid at which the electrical resistivity of the anti-static liquid is equal to that of the processing liquid (Step S613).

Next, a temporary target temperature which is slightly lower than the temperature acquired in Step S613 is set and an anti-static liquid at the temporary target temperature is prepared (Steps S614 and S615). Concurrently with the preparation of the anti-static liquid, a test substrate having the same structure as the above-discussed substrate 9 is prepared. The anti-static liquid is supplied onto an upper surface (on which a device is formed in advance) of the test substrate, and the puddle process is performed with the anti-static liquid. The upper surface of the test substrate is thereby entirely brought into contact with the anti-static liquid and the state (wetted state) in which the test substrate is in contact with the anti-static liquid is maintained for a predetermined time period, and the amount of electric charges on the test substrate thereby decreases. In other words, a static elimination process for the test substrate is thus performed (Step S616).

After the static elimination process is finished, the test substrate is rotated, and the anti-static liquid is thereby removed from the upper surface of the test substrate. Subsequently, the processing liquid is supplied onto the upper surface of the test substrate, and a predetermined processing (SPM process) is performed like in Step S76 (Step S617).

After the SPM process is finished, the state of the upper surface of the test substrate is evaluated by observation or the like (Step S618), and when the state of the upper surface is good (Step S619), the temporary target temperature is determined as the target temperature. The target temperature is stored in the storage part 8a (Step S623). In Step S619, when there is no damage to the device on the upper surface of the test substrate, the state of the upper surface is evaluated to be good, and when there is damage to the device, the state of the upper surface is evaluated to be not good.

When the state of the upper surface of the test substrate is not good (Step S619), the time period required for the static elimination process (i.e., the time period for which the wetted state in which the test substrate is in contact with the anti-static liquid is maintained) in Step S616 is changed to be longer, and the static elimination process is performed on a new test substrate (Steps S620, S621, and S616). Then, the SPM process and the evaluation of the state of the upper surface of the test substrate are performed (Steps S617 and S618). The static elimination process with the time period therefor changed, the SPM process, and the evaluation of the test substrate are repeated predetermined times (Steps S619 to S621). When the state of the upper surface of the test substrate, however, is determined to be good before the repeat of these processings predetermined times is completed, the temporary target temperature is determined as the target temperature, and the time period for the static elimination process in Step S616 of the last operation is determined as the time period for the static elimination process in Step S73. This static elimination time is stored in the storage part 8a (Step S623).

On the other hand, when the state of the upper surface of the test substrate is not determined to be good even after the repeat of these processings predetermined times is completed, the temporary target temperature is reduced (Steps S619, S620, and S622). In other words, a temperature lower than the last temporary target temperature is set as the temporary target temperature. Then, for a new test substrate, the static elimination process, the SPM process, and the evaluation of the test substrate are performed (Steps S616 to S618). When the state of the upper surface of the test substrate becomes good, the temporary target temperature is determined as the target temperature (Steps S619 and S623). Further, when the state of the upper surface of the test substrate is not good, the static elimination time is changed to be longer (Steps S619 to S621), and then the static elimination process, the SPM process, and the evaluation of the test substrate are repeated predetermined times (Steps S616 to S621).

Thus, by repeating Steps S616 to S622, the temporary target temperature and the static elimination time at/for which the state of the upper surface of the test substrate after the SPM process is good are determined as the target temperature and the static elimination time, respectively (Step S623). Then, in the substrate processing apparatus 10c, by performing the static elimination process using the anti-static liquid at the target temperature, it is possible to prevent any damage to the substrate 9 in the processing using the processing liquid. Further, by performing the static elimination process for the static elimination time which is thus set, it is possible to prevent the static elimination time from becoming too long.

Furthermore, in the process for determining a target static elimination temperature, a temperature which is slightly lower than the temperature of the anti-static liquid at which the electrical resistivity of the anti-static liquid is equal to that of the processing liquid is determined as the temporary target temperature at a starting point of the process for obtaining the target static elimination temperature (Step S614), and the temporary target temperature is gradually reduced (Step S622) and the temporary target temperature at the time when the state of the upper surface of the test substrate becomes good is determined as the final target temperature (Step S622). Since the static elimination time can be made shorter as the temperature of the anti-static liquid is higher, it is possible to determine the temperature at which the static elimination time is the shortest, among the temperature range in which no damage is given to the upper surface of the test substrate, as the final target temperature.

Setting of the temporary target temperature may be performed, for example, by the method shown in FIG. 9. In such a case, first, the electrical resistivity of the processing liquid (SPM liquid) to be used in Step S76 is measured and obtained (Step S631). Subsequently, electrical resistivity which is slightly higher than the electrical resistivity of the processing liquid is set as the temporary target electrical resistivity (Step S632). Further, the relation between the temperature of the anti-static liquid (deionized water) and the electrical resistivity thereof shown in FIG. 3 is also obtained (Step S633). Then, on the basis of the relation obtained in Step S633, the temperature of the anti-static liquid at which the electrical resistivity of the anti-static liquid is equal to the electrical resistivity set in Step S632 is acquired as the temporary target temperature (Step S634).

Hereinafter, the same process steps as the above Steps S615 to S623 are performed, and the temporary target temperature and the static elimination time at/for which the state of the upper surface of the test substrate after the SPM process is good are determined as the target temperature and the static elimination time, respectively. Then, in the substrate processing apparatus 10c, by performing the static elimination process using the anti-static liquid at the target temperature, it is possible to prevent any damage to the substrate 9 in the processing using the processing liquid. Further, by performing the static elimination process for the static elimination time which is thus set, it is possible to prevent the static elimination time from becoming too long. The processes for determining the target temperature shown in FIGS. 8A, 8B, and 9 may be performed in the substrate processing apparatus 10c or may be performed without using the substrate processing apparatus 10c.

In the substrate processing apparatus 10c shown in FIG. 18, there may be another case where an electrical resistivity meter is used as the anti-static liquid measurement part 62 and the electrical resistivity of the anti-static liquid is measured by the anti-static liquid measurement part 62. In such a case, in the substrate processing apparatus 10c, the temperature of the anti-static liquid is adjusted by the above-discussed method shown in FIG. 10 or 11.

Figure 21:
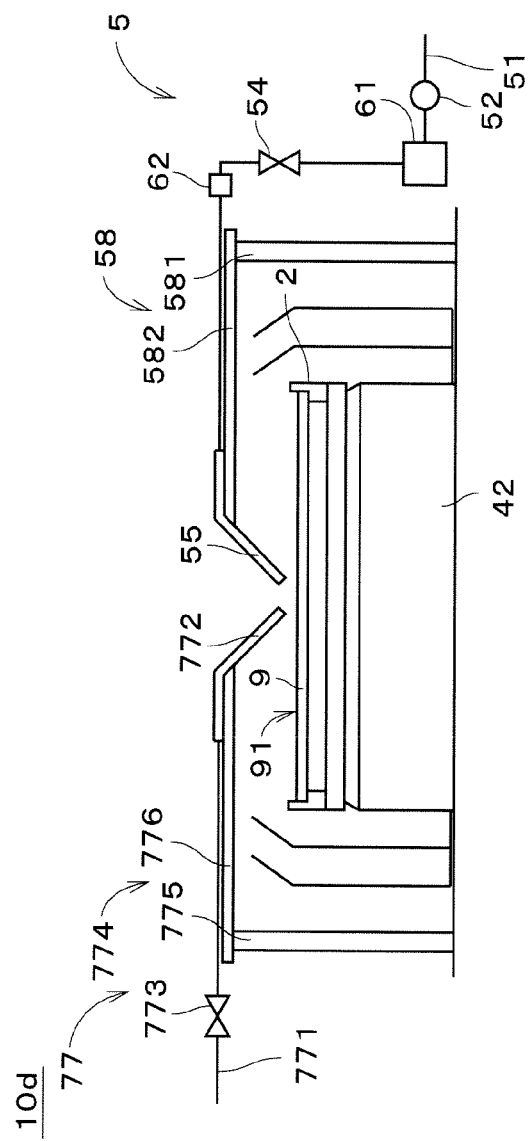
FIG. 21 is a view showing a configuration of a substrate processing apparatus in accordance with a fifth preferred embodiment of the present invention.

Next, discussion will be made on a substrate processing apparatus 10d in accordance with the fifth preferred embodiment of the present invention. FIG. 21 is a view showing a configuration of the substrate processing apparatus 10d of the fifth preferred embodiment. The substrate processing apparatus 10d includes an IPA supply part 77 for supplying liquid isopropyl alcohol (hereinafter, referred to as "IPA") onto the upper surface 91 of the substrate 9, besides the constitution of the substrate processing apparatus 10c shown in FIG. 18. The constituent elements other than the above are identical to those in the substrate processing apparatus 10c of FIG. 18 and the corresponding elements are represented by the same reference signs in the following discussion. Though the processing liquid supply part 3 is omitted in FIG. 21 for convenience of illustration, the constitution of the processing liquid supply part 3 is the same as that in the substrate processing apparatus 10c of FIG. 18. Further, in FIG. 21, the control part 8 is also omitted.

The IPA supply part 77 includes an IPA pipe 771 connected to a not-shown IPA storage part, an IPA nozzle 772 connected to a front end of the IPA pipe 771, an IPA valve 773 provided on the IPA pipe 771, and an IPA nozzle rotating mechanism 774 for horizontally rotating the IPA nozzle 772 about a rotation axis 775. The IPA nozzle rotating mechanism 774 includes an arm 776 horizontally extending from the rotation axis 775, to which the IPA nozzle 772 is attached.

Figure 22:
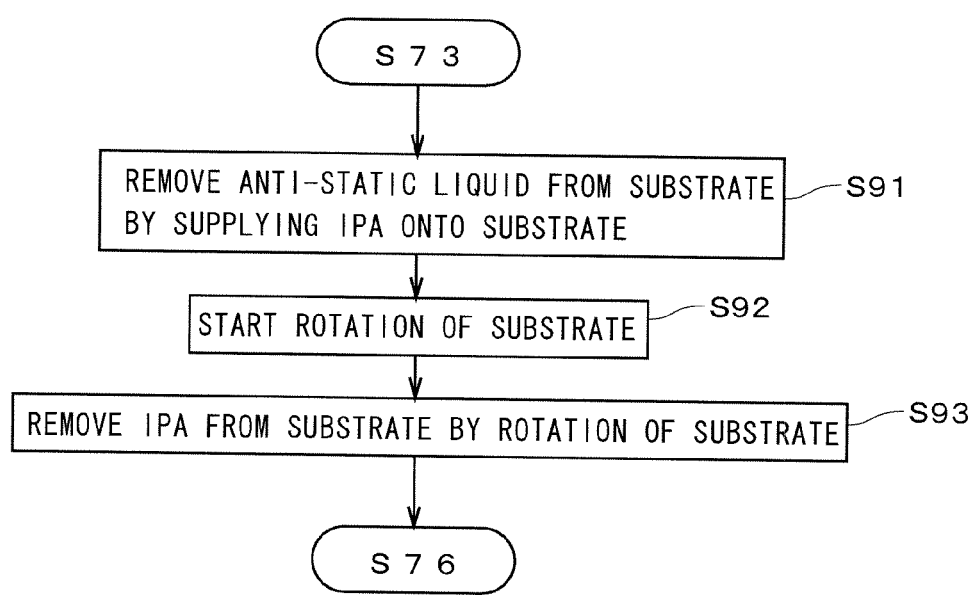
FIG. 22 is a flowchart showing a partial operation flow for processing a substrate.

FIG. 22 is a flowchart showing a partial operation flow for processing the substrate 9 in the substrate processing apparatus 10d. In the substrate processing apparatus 10d, after the same process steps as Steps S71 to S73 shown in FIG. 19 are performed, Steps S91 to S93 shown in FIG. 22 are performed and then the same process steps as Steps S76 to S80 shown in FIG. 19 are performed.

Specifically, first, the target temperature of the anti-static liquid (deionized water) which is determined on the basis of the size of the device on the substrate 9 or the like is set into the control part 8 (see FIG. 18) (Step 71). Subsequently, the substrate 9 which is electrically charged by the drying process is loaded into the substrate processing apparatus 10d and held by the substrate holding part 2. Further, the temperature adjustment part 61 adjusts the temperature of the anti-static liquid within the temperature range in which the electrical resistivity of the anti-static liquid is higher than the electrical resistivity of the processing liquid (SPM liquid) (Step S72). Then, the anti-static liquid is supplied onto the substrate 9 from the anti-static liquid supply part 5 and the entire upper surface 91 of the substrate 9 is puddled with the anti-static liquid, and thus the static elimination process is performed (Step S73).

After the static elimination process for the substrate 9 is finished, the anti-static liquid nozzle rotating mechanism 58 rotates the anti-static liquid nozzle 55 to be moved from the position shown in FIG. 21 back to the waiting position outside the substrate 9. Further, the IPA nozzle rotating mechanism 774 moves the IPA nozzle 772 from the waiting position and as shown in FIG. 21, an outlet at a front end of the IPA nozzle 772 is directed to the center portion of the upper surface 91 of the substrate 9. Subsequently, the control part 8 opens the IPA valve 773 of the IPA supply part 77, and the IPA is thereby supplied onto the substrate 9. On the substrate 9, the anti-static liquid is moved toward the edge of the substrate 9 by the IPA supplied onto the center portion of the upper surface 91 and pushed out of the edge of the substrate 9, thereby being removed from the upper surface 91 of the substrate 9 (Step S91). Thus, the IPA supply part 77 serves as the liquid removing part for removing the liquid, such as the anti-static liquid or the like on the substrate 9, from the upper surface 91 of the substrate 9 by replacing the liquid with the IPA.

After the removal of the anti-static liquid is finished, the IPA nozzle 772 is moved back to the waiting position, and the control part 8 controls the substrate rotating mechanism 42 to start rotation of the substrate 9 (Step S92). Then, with the rotation of the substrate 9, the IPA on the upper surface 91 of the substrate 9 is moved toward the edge of the substrate 9 and scattered out of the edge of the substrate 9, thereby being removed from the substrate 9 (Step S93).

After the removal of the IPA is finished, the number of rotations of the substrate 9 by the substrate rotating mechanism 42 decreases to the number of rotations in the SPM process. Further, the processing liquid nozzle rotating mechanism 35 shown in FIG. 18 starts rotation of the processing liquid nozzle 34 and the processing liquid nozzle 34 thereby repeats reciprocating motion between the center portion of the substrate 9 and the edge thereof. Then, the SPM liquid is supplied onto the upper surface 91 of the substrate 9 from the processing liquid nozzle 34 and the SPM process is performed on the substrate 9 (Step S76). Further, the supply of the SPM liquid onto the substrate 9 may be started while the IPA remains on the substrate 9.

After the SPM process is finished, the hydrogen peroxide water is supplied onto the substrate 9 from the processing liquid nozzle 34 and the SPM liquid is removed from the substrate 9 (Step S77). After the hydrogen peroxide water supplying process is finished, the processing liquid nozzle 34 is moved back to the waiting position outside the substrate 9, and the rinse process for supplying the rinse liquid (deionized water) onto the upper surface 91 of the substrate 9 is performed, to thereby remove the hydrogen peroxide water from the substrate 9 (Step S78). Then, the number of rotations of the substrate 9 is increased, and the drying process for removing the rinse liquid remaining on the substrate 9 by the rotation of the substrate 9 is performed (Step S79). After that, the rotation of the substrate 9 is stopped (Step S80), and the substrate 9 is unloaded from the substrate processing apparatus 10d.

In the substrate processing apparatus 10d, like in the substrate processing apparatus 10c of FIG. 18, by adjusting the temperature of the anti-static liquid by the temperature adjustment part 61, the entire upper surface 91 of the substrate 9 is puddled with the anti-static liquid while the electrical resistivity of the anti-static liquid is maintained higher than that of the processing liquid (SPM liquid). It is thereby possible to perform the static elimination process on the substrate 9 without giving any damage to the device. As a result, it is possible to prevent any damage to the device. i.e., any damage to the substrate 9, due to the movement of the electric charges in the processing using the processing liquid. Further, since the temperature of the anti-static liquid is made higher and the electrical resistivity thereof is made lower within the range in which no damage is given to the device, it is possible to increase the movement speed of the electric charges from the substrate 9 to the anti-static liquid. As a result, it is possible to reduce the time required to perform the static elimination process on the substrate 9.

In the substrate processing apparatus 10d, like in the substrate processing apparatus 10c of FIG. 18, between the puddle process with the anti-static liquid (Step S73) and the processing using the processing liquid (Step S76), the anti-static liquid is removed from the upper surface 91 of the substrate 9 (Step S91). It is thereby possible to prevent the above-discussed adverse effects such as heat shock due to the mixture of the anti-static liquid and the processing liquid.

Further, in Step S91, by supplying the IPA onto the substrate 9, it is possible to remove the anti-static liquid without rotating the substrate 9. When the substrate 9 is rotated to remove the anti-static liquid therefrom, if the width of wiring pattern in the device formed on the substrate 9 is small, there is a possibility of breaking the wiring pattern by the surface tension of the anti-static liquid. In the substrate processing apparatus 10d, as discussed above, since the anti-static liquid is removed from the substrate 9 by using the IPA having surface tension lower than that of deionized water or the like and then the IPA is removed by the rotation of the substrate 9, it is possible to prevent the damage to the substrate 9 such as the break in the wiring pattern or the like in the removal of the anti-static liquid.

Further, since the substrate processing apparatus 10d includes the substrate rotating mechanism 42 and the IPA supply part 77, one of the substrate rotating mechanism 42 and the IPA supply part 77 may be selected to be used as the liquid removing part in accordance with the size of the device formed on the substrate 9, or the like. In other words, in the substrate processing apparatus 10d, the liquid removing part includes the substrate rotating mechanism 42 and the IPA supply part 77.

The above-discussed substrate processing apparatuses 10 and 10a to 10d allow various variations.

In the substrate processing apparatus 10, for example, the temperature or the electrical resistivity of the anti-static liquid stored in the anti-static liquid storage part 71 may be measured by the anti-static liquid measurement part 62. Further, a mechanism for heating or cooling the anti-static liquid inside the anti-static liquid storage part 71 as necessary may be provided as the temperature adjustment part 61.

In the static elimination process in the substrate processing apparatus 10b, the supply of the anti-static liquid onto the upper surface 91 and the puddle process may be performed while the substrate 9 is rotated only if the layer of the anti-static liquid on the upper surface 91 of the substrate 9 can be maintained, not being broken. Further, the puddle process on the upper surface 91 of the substrate 9 by using the anti-static liquid may be performed before or concurrently with the supply of the anti-static liquid onto the lower surface 92 of the substrate 9.

In the substrate processing apparatuses 10c and 10d, the liquid removing part may include a constituent element other than the substrate rotating mechanism 42 or the IPA supply part 77. For example, an air knife for injecting sheet-like air toward the upper surface 91 of the substrate 9 to scatter and remove the liquid from the substrate 9 may be provided as the liquid removing part.

If the mixture of the anti-static liquid and the processing liquid causes no adverse effect, the drying process in Step S15 may be omitted in the substrate processing apparatus 10. Further, in the substrate processing apparatus 10b, the process of Step S17 may be performed without removing the anti-static liquid form the substrate 9 in Step S16. Furthermore, in the substrate processing apparatuses 10c and 10d, there may be another case where the process step of removing the anti-static liquid (Steps S75 and S91) is omitted and the processing liquid is supplied onto the upper surface 91 of the substrate 9, with the anti-static liquid left thereon, to thereby perform the processing of the substrate 9.

In the above-discussed substrate processing apparatuses, a processing liquid other than the SPM liquid may be supplied onto the substrate 9 to thereby perform other processing on the substrate 9. For example, buffered hydrofluoric acid (BHF) may be supplied as the processing liquid onto the substrate 9 with the resist film formed thereon, to thereby perform an etching process on the substrate 9. In the substrate processing apparatuses, as discussed above, since it is possible to prevent any damage to the substrate 9 due to the rapid movement of the electric charges caused by the contact between the electrically charged substrate 9 and the processing liquid, the constitution of the substrate processing apparatus is particularly suitable for an apparatus for performing a processing using a processing liquid having very low electrical resistivity, such as the SPM liquid or the buffered hydrofluoric acid.

In the above-discussed substrate processing apparatuses, as the anti-static liquid, a solution in which ammonia is dissolved in deionized water or a solution in which a very small amount of dilute hydrochloric acid is added to deionized water may be used, and liquids containing other various ions may be used. Further, the anti-static liquid is not limited to deionized water or the ionic liquid, but various kinds of liquids may be used as the anti-static liquid only if the electrical resistivity of the liquids is higher than that of the processing liquid used in the substrate processing apparatuses at least in a predetermined temperature range not lower than the freezing point and not higher than the boiling point In the substrate processing apparatuses, the target temperature and the target electrical resistivity of the anti-static liquid may be determined on the basis of conditions (e.g., the kind (s) of processing (s) performed on the substrate before the loading of the substrate into the substrate processing apparatus) other than the size of the device.

The configurations in the above-discussed preferred embodiments and variations may be combined as appropriate only if those do not conflict with one another.

While the invention has been shown and described in detail, the foregoing description is in all aspects illustrative and not restrictive. It is therefore understood that numerous modifications and variations can be devised without departing from the scope of the invention. This application claims priority benefit under 35 U.S.C. Section 119 of Japanese Patent Application No. 2012-286859 filed in the Japan Patent Office on Dec. 28, 2012 and Japanese Patent Application No. 2012-286860 filed in the Japan Patent Office on Dec. 28, 2012, the entire disclosures of which are incorporated herein by reference.

REFERENCE SIGNS LIST

2 Substrate holding part
3 Processing liquid supply part
5 Anti-static liquid supply part
7, 7a Anti-static liquid contacting part
8 Control part
9 Substrate
10, 10a to 10d Substrate processing apparatus
42 Substrate rotating mechanism
61 Temperature adjustment part
62 Anti-static liquid measurement part
71, 71a Anti-static liquid storage part
77 IPA supply part
91 Upper surface
92 Lower surface
95 Anti-static liquid
725 Anti-static liquid nozzle
761 Lower surface liquid-contacting part
S11 to S21, S31, S41 to S44, S71 to S80, S91 to S93, S121 to S126, S321 to S326, S611 to S623, S631 to S634 Step

The invention claimed is:

1. A substrate processing method of processing a substrate, comprising:
  a) controlling a temperature of an anti-static liquid having electrical resistivity which gradually decreases as a liquid temperature increases, to be within a range in which said electrical resistivity of said anti-static liquid is higher than electrical resistivity of a processing liquid;
  b) bringing entirely both main surfaces of a substrate into contact with said anti-static liquid to maintain a wetted state, to thereby reduce electric charges on said substrate, after said operation a); and
  c) supplying said processing liquid onto one main surface of said substrate to thereby perform a predetermined process after said operation b), wherein
  said operation a) comprises:
    a1) measuring said temperature of said anti-static liquid;
    a2) adjusting said temperature of said anti-static liquid on the basis of a measurement result obtained in said operation a1) so that a difference between said temperature of said anti-static liquid and a predetermined target temperature becomes smaller; and
    a3) repeating said operation a1) and said operation a2), and
  said substrate processing method further comprises, before said operation a):
    d1) obtaining said electrical resistivity of said processing liquid;
    d2) setting a temporary target electrical resistivity higher than said electrical resistivity of said processing liquid;
    d3) obtaining a relation between said temperature of said anti-static liquid and said electrical resistivity thereof;
    d4) acquiring a temperature of said anti-static liquid at which said electrical resistivity of said anti-static liquid is equal to said temporary target electrical resistivity set in said operation d2), as a temporary target temperature, on the basis of said relation obtained in said operation d3);
    d5) preparing an anti-static liquid having said temporary target temperature;

d6) bringing entirely both main surfaces of a test substrate into contact with said anti-static liquid having said temporary target temperature to maintain a wetted state, to thereby reduce electric charges on said test substrate;

d7) supplying said processing liquid onto one main surface of said test substrate to thereby perform a predetermined process;

d8) evaluating a state of said one main surface of said test substrate after said operation d7); and d9) setting said temporary target temperature as said target temperature when said state of said one main surface is in a no-damage state in which there is no damage to a device on said one main surface, or repeating said operations d5) to d8) with said temporary target temperature lowered until said state of said one main surface becomes in the no-damage state and then determining said temporary target temperature at the time when said state becomes in the no-damage state, as said target temperature, when said state of said one main surface is in a damaged state.

2. The substrate processing method according to claim 1, wherein
said anti-static liquid being in contact with said one main surface of said substrate and said anti-static liquid being in contact with the other main surface of said substrate are continuous with each other on said substrate.

3. The substrate processing method according to claim 2, wherein
said substrate is immersed in said anti-static liquid stored in an anti-static liquid storage part to thereby bring said one main surface and said other main surface into contact with said anti-static liquid in said operation b).

4. The substrate processing method according to claim 3, wherein
a plurality of substrates including said substrate which are arranged so that the directions of the normals of respective main surfaces thereof are directed to a horizontal direction are immersed in said anti-static liquid stored in said anti-static liquid storage part in said operation b).

5. The substrate processing method according to claim 1, wherein
said operation b) comprises:
b1) supplying said anti-static liquid onto said one main surface of said substrate which is held with said one main surface thereof directed upward to thereby puddle entirely said one main surface with said anti-static liquid: and
b2) discharging said anti-static liquid onto said other main surface of said substrate to thereby bring entirely said other main surface into contact with said anti-static liquid.

6. The substrate processing method according to claim 1, wherein
lower target temperature is set as the size of the device which is formed on said substrate in advance is smaller.

7. The substrate processing method according to claim 1, further comprising, between said operation d8) and said operation d9),
performing said operations d6) to d8) with a processing time of said operation d6) changed when said state of said one main surface is in the damaged state.

8. The substrate processing method according to claim 1, wherein said operation a) comprises:
a1) measuring said temperature of said anti-static liquid; and
a2) on the basis of a measurement result obtained in said operation a 1), not performing temperature adjustment of said anti-static liquid when a difference between said temperature of said anti-static liquid and a predetermined target temperature is not higher than a threshold temperature difference, or adjusting said temperature of said anti-static liquid so that said difference between said temperature of said anti-static liquid and said target temperature becomes smaller when said difference between said temperature of said anti-static liquid and said target temperature is higher than said threshold temperature difference.

9. The substrate processing method according to claim 1, further comprising:
e) removing said anti-static liquid from said one main surface of said substrate between said operation b) and said operation c).

10. The substrate processing method according to claim 1, wherein
said anti-static liquid is deionized water.

11. The substrate processing method according to claim 1, wherein
said processing liquid includes sulfuric acid.

12. A substrate processing method of processing a substrate, comprising:
a) controlling a temperature of an anti-static liquid having electrical resistivity which gradually decreases as a liquid temperature increases, to be within a range in which said electrical resistivity of said anti-static liquid is higher than electrical resistivity of a processing liquid;

b) supplying said anti-static liquid onto a main surface of a substrate which is held with said main surface thereof directed upward to puddle entirely said main surface of said substrate with said anti-static liquid, to thereby reduce electric charges on said substrate; and c) supplying said processing liquid onto said main surface of said substrate to thereby perform a predetermined process after said operation b), wherein said operation a) comprises:
a1) measuring said temperature of said anti-static liquid;
a2) adjusting said temperature of said anti-static liquid on the basis of a measurement result obtained in said operation a1) so that a difference between said temperature of said anti-static liquid and a predetermined target temperature becomes smaller; and
a3) repeating said operation a1) and said operation a2), and said substrate processing method further comprises, before said operation a):
d1) obtaining said electrical resistivity of said processing liquid;
d2) setting a temporary target electrical resistivity higher than said electrical resistivity of said processing liquid;
d3) obtaining a relation between said temperature of said anti-static liquid and said electrical resistivity thereof;
d4) acquiring a temperature of said anti-static liquid at which said electrical resistivity of said anti-static liquid is equal to said temporary target electrical resistivity set in said operation d2), as a temporary target temperature, on the basis of said relation obtained in said operation d3);

d5) preparing an anti-static liquid having said temporary target temperature;

d6) supplying said anti-static liquid onto a main surface of a test substrate to puddle entirely said main surface of said test substrate with said anti-static liquid, to thereby reduce electric charges on said test substrate;

d7) supplying said processing liquid onto said main surface of said test substrate to thereby perform a predetermined process;

d8) evaluating a state of said main surface of said test substrate after said operation d7); and d9) setting said temporary target temperature as said target temperature when said state of said one main surface is in a no-damage state in which there is no damage to a device on said one main surface, or repeating said operations d5) to d8) with said temporary target temperature lowered until said state of said one main surface becomes in the no-damage state and then determining said temporary target temperature at the time when said state becomes in the no-damage state, as said target temperature, when said state of said one main surface is in a damaged state.

13. The substrate processing method according to claim 12, wherein
lower target temperature is set as the size of the device which is formed on said substrate in advance is smaller.

14. The substrate processing method according to claim 12, further comprising, between said operation d8) and said operation d9),
performing said operations d6) to d8) with a processing time of said operation d6) changed when said state of said main surface is in the damaged state.

15. The substrate processing method according to claim 12, wherein
said operation a) comprises:
a1) measuring said temperature of said anti-static liquid; and
a2) on the basis of a measurement result obtained in said operation a1), not performing temperature adjustment of said anti-static liquid when a difference between said temperature of said anti-static liquid and a predetermined target temperature is not higher than a threshold temperature difference, or adjusting said temperature of said anti-static liquid so that said difference between said temperature of said anti-static liquid and said target temperature becomes smaller when said difference between said temperature of said anti-static liquid and said target temperature is higher than said threshold temperature difference.

16. The substrate processing method according to claim 12, further comprising:
e) removing said anti-static liquid from said main surface of said substrate between said operation b) and said operation c).

17. The substrate processing method according to claim 16, wherein
said substrate is rotated about a rotation axis which goes through a center of said substrate and is perpendicular to said main surface of said substrate, to thereby remove a liquid from said main surface in said operation e).

18. The substrate processing method according to claim 17, wherein
said operation b) is performed while rotation of said substrate is stopped.

19. The substrate processing method according to claim 16, wherein
liquid isopropyl alcohol is supplied onto said main surface of said substrate to push a liquid on said main surface out of an edge of said substrate, to thereby remove said liquid from said main surface of said substrate in said operation e).

20. The substrate processing method according to claim 12, wherein
said anti-static liquid is deionized water.

21. The substrate processing method according to claim 12, wherein
said processing liquid includes sulfuric acid.

* * * * *